United States Patent
Zhao et al.

(10) Patent No.: US 12,271,663 B2
(45) Date of Patent: Apr. 8, 2025

(54) METHOD FOR COLLABORATIVE CONTROLLING NETWORKS RESILIENCE OF UNMANNED CLUSTER SYSTEM, TERMINAL, AND STORAGE MEDIUM THEREOF

(71) Applicant: HEFEI UNIVERSITY OF TECHNOLOGY, Hefei (CN)

(72) Inventors: Xiaomin Zhao, Hefei (CN); Zhengrong Cui, Hefei (CN); Fangfang Dong, Hefei (CN); Chang Pan, Hefei (CN); Binhe Li, Hefei (CN)

(73) Assignee: HEFEI UNIVERSITY OF TECHNOLOGY, Hefei (CN)

( * ) Notice: Subject to any disclaimer, the term of this patent is extended or adjusted under 35 U.S.C. 154(b) by 0 days.

(21) Appl. No.: 18/603,317

(22) Filed: Mar. 13, 2024

(65) Prior Publication Data

US 2024/0330527 A1 Oct. 3, 2024

(30) Foreign Application Priority Data

Mar. 22, 2023 (CN) .......................... 202310282721.5

(51) Int. Cl.
*G06F 30/18* (2020.01)
*G05D 1/69* (2024.01)

(52) U.S. Cl.
CPC ............... *G06F 30/18* (2020.01); *G05D 1/69* (2024.01)

(58) Field of Classification Search
CPC .................................. G06F 30/18; G05D 1/69
See application file for complete search history.

(56) References Cited

U.S. PATENT DOCUMENTS

| 8,712,559 B2 * | 4/2014 | Cao | G05B 13/048 700/48 |
| 10,931,687 B2 * | 2/2021 | Mestha | G06N 20/00 |

FOREIGN PATENT DOCUMENTS

| CN | 112684709 A | 4/2021 |
| CN | 112859869 A | 5/2021 |

OTHER PUBLICATIONS

Hao, Z., et al. "Full-State-Constrained Non-Certainty-Equivalent Adaptive Control for Satellite Swarm Subject to Input Fault" IEEE J. Automatica Sinica, vol. 9, No. 3 (2022) (Year: 2022).*

(Continued)

*Primary Examiner* — Jay Hann
(74) *Attorney, Agent, or Firm* — Hemisphere Law, PLLC; Zhigang Ma

(57) ABSTRACT

A method for collaborative controlling networks resilience of an unmanned cluster system a computer terminal and a computer readable storage media thereof are invented. The method includes: collecting both targets for tracking and the spatial status information of each unmanned system in the unmanned cluster system; establishing a kinematic model of the unmanned cluster system and constructing a dynamic model of each unmanned system accordingly; constructing an uncertainty boundary function and a adaptive robust controller of each unmanned system accordingly. Then it can effectively deal with the uncertainty of system parameters and the influence of network attack input of the unmanned cluster system by the present invention.

13 Claims, 8 Drawing Sheets

(56) References Cited

OTHER PUBLICATIONS

Sun, Q., et al. "Adaptive Robust Formation Control of Connected and Autonomous Vehicle Swarm System Based on Constraint Following" IEEE Transactions on Cybernetics, vol. 53, No. 7 (Jul. 2023) (Year: 2023).*

Zhao, X., et al. "A Leader-Follower Sequential Game Approach to Optimizing Parameters for Intelligent Vehicle Formation Control" Int'l J. Fuzzy Syst., vol. 24, No. 3, pp. 1390-1405 (2022) (Year: 2022).*

Dong, F., et al. "Optimal Design of Adaptive Robust Control for Fuzzy Swarm Robot Systems" Int'l J. Fuzzy Syst., vol. 21, No. 4, pp. 1059-1072 (2019) (Year: 2019).*

Roy, S., et al. "Adaptive-Robust Control of Euler-Lagrange Systems With Linearly Parametrizable Uncertainty Bound" IEEE Transactions on Control Systems Tech., vol. 26, No. 5 (2018) (Year: 2018).*

Udwadia, F. "A New Approach to Stable Optimal Control of Complex Nonlinear Dynamical Systems" J. Applied Mechanics, vol. 81 (2014) (Year: 2014).*

Xiaomin Zhao etc, "Collision avoidance adaptive robust control for autonomous vehicles: Motivated by swarm properties", 2017 29th Chinese Control And Decision Conference (CCDC), Chongqing, China, 2017, p. 4955-4961, May 31, 2017.

CNIPA, Notification of First Office Action for CN202310282721.5, May 25, 2023.

CNIPA, Notification to grant patent right for invention in CN202310282721.5, Jun. 13, 2023.

CNIPA, Search report for CN202310282721.5, May 19, 2023.

* cited by examiner

METHOD FOR COLLABORATIVE CONTROLLING NETWORKS RESILIENCE OF UNMANNED CLUSTER SYSTEM, TERMINAL, AND STORAGE MEDIUM THEREOF

FIELD OF THE INVENTION

The present invention relates to methods for collaborative control, and more particularly to a method for collaborative controlling networks resilience of an unmanned cluster system, a computer terminal, and a computer readable storage media thereof.

BACKGROUND OF THE INVENTION

As the ability of sensing, computing, information processing, and energy storaging is being steadily improved, unmanned system technology, represented by unmanned vehicles, unmanned drones, unmanned ships, etc., has developed rapidly. Due to limitations in power function performance and other aspects, a single unmanned system is difficult to adapt to complex environmental changes and meet changeable task requirements in practical applications. For example, tasks such as resource exploration, military operations, post-disaster rescue, and other tasks usually require multiple unmanned systems to perform tasks cooperatively. The cluster system with multiple unmanned systems operating cooperatively can realize mutual behavior coordination, quickly adapt to the dynamic environment, and have the ability to perform complex and changeable tasks, which has broad application prospects in transportation, agriculture, manufacturing, military medical treatment, and other fields.

Cooperative control is one of the key technologies in the application of unmanned cluster systems, which makes multiple individuals in the cluster work together to complete complex tasks by designing appropriate control methods and strategies. For example, patent CN114610072A discloses a distributed time-varying formation tracking controller construction method based on the UAV dynamics model and inner and outer loop control structure, which can realize distributed formation tracking motion of multiple UAV cluster systems For example, patent CN115407798A discloses a robust control algorithm based on multi-UAV formation model and error function integral, which can realize multi-UAV cluster trajectory tracking under the influence of external unknown disturbance For example, patent CN111766899B discloses a four-rotor UAV cluster anti-interference formation control method based on interference observer, which can improve the active anti-interference ability of the whole formation and reduce the overall energy loss of the formation.

In practice for the control field, the unmanned cluster system may have nonlinear dynamics characteristics, and a plenty of model systems may have uncertainties caused by parameter perturbations and external perturbations. However, when studying the collaborative control technology of unmanned cluster systems, the existing technology rarely takes into account the uncertainty of system parameters and the influence of network attack input. The unmanned systems in the cluster rely on communication networks to exchange information, so when the cluster is subjected to network attacks, the stability of the system collaborative control will be difficult to maintain.

SUMMARY OF THE INVENTION

The object of the present invention is to provide a method for collaborative controlling networks resilience of an unmanned cluster system to solve the problem that the stability of the system will be difficult to maintain. Another object of the present invention is to provide a computer terminal used the method. The third object of the present invention is to provide a readable computer storage media used the method.

The present invention provides a method for collaborative controlling networks resilience of an unmanned cluster system, including the following steps S1~S5.

Step S1, collect both targets for tracking and the spatial status information of each unmanned system in the unmanned cluster system.

Step S2, establish a kinematic model of the unmanned cluster system to get the constraint following error of each unmanned system according to the target and the spatial status information correspondingly.

Step S3, construct a dynamic model of each unmanned system, the dynamic models are affected by the uncertainty of system parameters and the influence of network attack input of the unmanned cluster system.

Step S4, construct an uncertainty boundary function of each unmanned system based on the dynamic model correspondingly, and the uncertainty boundary function involves the uncertainty and the influence correspondingly.

Step S5, design an adaptive robust controller of each unmanned system according to the constraint following error and the uncertainty boundary function correspondingly.

In the method for collaborative controlling networks resilience of the present invention, in step S1, the spatial status information of each target includes $p^*$ and $\dot{p}^*(t)$ also named $\dot{p}^*$, $p^*$ meaning the spatial position of the corresponding target, $\dot{p}^*$ meaning the speed of the corresponding target. The spatial status information of each unmanned system includes $p^i$ and $\dot{p}^i(t)$ also named $\dot{p}^i$, $p^i \in R^k$, k meaning the coordinate dimension of each unmanned system, $R^k$ meaning k dimensional vector space in the field of real numbers.

In the method for collaborative controlling networks resilience of the present invention, step S2 includes details of the method for getting the constraint following error.

The method for getting the constraint following error includes steps S21~S24.

Step S21, ensure a potential function $U_{ij}(\bullet)$ with regard to the i'th unmanned system and the j'th unmanned system, and solve the partial derivative of the potential function $U_{ij}(\bullet)$ according to $p^i$ and $p^j$, $p^j$ meaning the spatial position of the j'th unmanned system, $j \in N^+$, $N^+ = \{1, 2, \ldots, n\}$, n meaning the total number of the unmanned systems.

Step S22, ensure a potential function $U_{i*}(\bullet)$ with regard to the i'th unmanned system and the corresponding target; and solve the partial derivative of the potential function $U_{i*}(\bullet)$ according to $p^i$ and $p^*$.

Step S23, establish the kinematic model of the unmanned cluster system:

$$\dot{p}^i = -\sum_{j=1, j\neq i}^{n} \frac{\partial U_{ij}}{\partial p^i}(p^i, p^j) - \frac{\partial U_{i*}}{\partial p^i}(p^i, p^*) + \dot{p}^*.$$

Step S24, transform the kinematic model to a first-order constrained-differential equation with performance constrain:

$$A_i(p^i, t)\dot{p}^i = c_i(p^i, t).$$

solve the partial derivative of the first-order constrained-differential equation to a second-order standard constraint form by transposing:

$$A_i(p^i, t)\ddot{p}^i = b_i(p^i, \dot{p}^i, t).$$

Then, get the constraint following error $\epsilon_i$:

$$\epsilon_i = A_i(p^i, t)\dot{p}^i - c_i(p^i, t).$$

Where, $A_i(p^i,t)$ means an inertia matrix of the i'th unmanned system. t meaning time. $c_i(p^i,t)$ means the first-order constrained vector of the i'th unmanned system. $b_i(p^i, \dot{p}^i, t)$ means the second-order constrained vector of the i'th unmanned system.

In the method for collaborative controlling networks resilience of the present invention, the method for constructing the dynamic model includes steps S31~S33.

Step S31, constructing the dynamic model as follows:

$$\mathcal{M}_i(p^i(t), \varrho_i(t), t)\ddot{p}^i(t) + C_i(p^i(t), \dot{p}^i(t), \varrho_i(t), t)\dot{p}^i(t) +$$
$$G_i(p^i(t), \varrho_i(t), t) + F_i(p^i(t), \dot{p}^i(t), \varrho_i(t), t) = \tau_i(t).$$

Where, $\varrho_i(t) \subset \Gamma_i \subset R^p$. $\Gamma_i \subset R^p$ means compact set of the unmanned cluster system. $R^p$ means p dimensional vector space in the field of real numbers. $\Gamma_i$ means the possible boundary of $\varrho_i(t)$. $\ddot{p}^i(t)$ means the accelerated speed of the i'th unmanned system also named $\ddot{p}^i$. $\mathcal{M}_i(p^i,\varrho_i,t)$ meaning an inertia matrix of the i'th unmanned system. $C_i(p^i,\dot{p}^i,\varrho_i,t)\dot{p}^i$ means the Coriolis/Centrifugal force. $G_i(p^i,\varrho_i,t)$ means the gravitational force. $F_i(p^i,\dot{p}^i,\varrho_i,t)$ means the other force. $\tau_i(t)$ means an input of control force. $\mathcal{M}_i(p^i,\varrho_i,t)$, $C_i(p^i,\dot{p}^i,\varrho_i,t)\dot{p}^i$, $F_i(p^i,\dot{p}^i,\varrho_i,t)$, $G_i(p^i,\varrho_i,t)$ all are exact dimensions. $M_i(\bullet)$, $C_i(\bullet)$, $G_i(\bullet)$, $F_i(\bullet)$ all are continuous function.

Step S32, considered the uncertainty of system parameters and the influence of network attack inputs, reconstruct the dynamic model as:

$$\mathcal{M}_i(p^i(t), \varrho_i(t), t)\ddot{p}^i(t) + C_i(p^i(t), \dot{p}^i(t), \varrho_i(t), t)\dot{p}^i(t) + G_i(p^i(t), \varrho_i(t), t) +$$
$$F_i(p^i(t), \dot{p}^i(t), \varrho_i(t), t) + D_{ai}(p^i(t), \dot{p}^i(t), t)v_{ai} = \phi_i(t)\tau_i(t).$$

Where $D_{ai}(p^i(t),\dot{p}^i(t),t)$ means input matrix of the network attack input of the i'th unmanned system. $v_{ai} \in \Sigma_i \subset R^l$, $\Sigma_i \subset R^l$ means the compact set of the unmanned cluster system. $R^l$ means l dimensional vector space in the field of real numbers. $\Sigma_i$ means the possible boundary of $V_{ai}$. $\phi_i(t)$ means an influence coefficient for controlling the network attack input. $D_{ai}(p^i(t),\dot{p}^i(t),t)$ is an exact dimension. $D_{ai}(\bullet)$ is a continuous function.

Step S33, set constraint conditions to the dynamic model:

If any $(p^i,t)$ is $(p^i,t) \subset R^k \times R$, $\varrho_i \in \Gamma_i$, the inertia matrix $M_i(p^i,\varrho_i,t)$ means a positive definite matrix.

If any $(p^i,t) \in R^k \times R$ and $A_i(p^i,t)$ is full rank, the inertia matrix $A_i(p^i,t) A_i^T(p^i,t)$ is reversible;

If any t is $t \in R$, $\phi_i(t)$ has a lower limiting value $\overline{\phi}_i$, $\overline{\phi}_i \leq \phi_i(t) \leq 1$.

In the method for collaborative controlling networks resilience of the present invention, t the method for constructing the uncertainty boundary function includes steps S41~S43.

Step S41, decompose the dynamic model of the i'th unmanned system as follows according to the effect on the uncertainty of system parameters, wich $\mathcal{M}_i$ is defined as the nominal part and the $\Delta\mathcal{M}_i(p^i,t)$ is defined as the uncertain part:

$$\begin{cases} \mathcal{M}_i(p^i, t) := \overline{\mathcal{M}}_i(p^i, t) + \Delta\mathcal{M}_i(p^i, t) \\ H_i(p^i, t) := \overline{\mathcal{M}}_i^{-1}(p^i, t) \\ \Delta H_i(p^i, \varrho_i, t) := \mathcal{M}_i^{-1}(p^i, \varrho_i, t) - \overline{\mathcal{M}}_i^{-1}(p^i, t) \cdot \\ E_i(p^i, \varrho_i, t) := \overline{\mathcal{M}}_i(p^i, t)\mathcal{M}_i^{-1}(p^i, \varrho_i, t) - I \\ \Delta H_i(p^i, \varrho_i, t) := H_i(p^i, t)E_i(p^i, \varrho_i, t) \end{cases}$$

Step S42, decompose the input matrix $D_{ai}$ of the i'th unmanned system based on the network attack input as follows:

$$D_{ai} = \hat{D}_{ai} + \tilde{D}_{ai}. \text{ Wherein:}$$

$$\begin{cases} \hat{D}_{ai} = (A_iH_i)^T[(A_iH_i)(A_iH_i)^T]^{-1}A_iH_iD_{ai} \\ \tilde{D}_{ai} = D_{ai} - (A_iH_i)^T[A_iH_i)(A_iH_i)^T]^{-1}A_iH_iD_{ai} \end{cases}.$$

Step S43, get the boundary function $\Theta_i(\gamma_i,p^i,\dot{p}^i,t)$ for describing the uncertainty boundary information of the uncertainty of system parameters and the influence of network attack input, the method of getting the boundary function $\Theta_i(\gamma_i,p^i,\dot{p}^i,t)$ includes:

(a) designing a formula with a constant vector $\gamma_i$ and the boundary function $\Theta_i(\gamma_i,p^i,\dot{p}^i,t)$ as follows:

$$\max_{\varrho_i \in \Gamma_i, v_{ai} \in \Sigma_i} \left\| K_iA_i(p^i,t) \begin{bmatrix} \mathcal{M}_i^{-1}(p^i,\varrho_i,t)\begin{pmatrix} -C_i(p^i,\dot{p}^i,\varrho_i,t)\dot{p}^i - G_i(p^i,\varrho_i,t) - \\ F_i(p^i,\dot{p}^i,\varrho_i,t) \end{pmatrix} - \\ H_i(p^i,t)\hat{D}_{ai}(p^i,\dot{p}^i,t)v_{ai} - \Delta H_i(p^i,t)D_{ai}(p^i,\dot{p}^i,t)v_{ai} \end{bmatrix} - K_ib_i \right\| \leq$$

$$(1 + \delta_{E_i})\Theta_i(\gamma_i, p^i, \dot{p}^i, t)$$

Wherein $\gamma_i$ means the uncertain variables of the i'th unmanned system. $K_i$ means a positive definite matrix of the i'th unmanned system. $\delta_{E_i}$ means a constant satisfying the following condition:

$$-2 < 2\delta_{E_i} \leq \min_{\varrho_i \in \Gamma_i} \lambda_{min}[\Phi_i(p^i, \varrho_i, t) + \Phi_i^T(p^i, \varrho_i, t)].$$

Wherein:

$$\Phi_i(p^i, \varrho_i, t) = K_i A_i(p^i, t) H_i(p^i, t) E_i(p^i, \varrho_i, t) \overline{M}_i(p^i, t) \times$$
$$A_i^T(p^i, t)(A_i(p^i, t) A_i^T(p^i, t))^{-1} K_i^{-1}.$$

$\lambda_{min}(\bullet)$ means the minimum value of the matrix eigenvalue.

(b) the boundary function $\Theta_i(\gamma_i, p^i, \dot{p}^i, t)$ is a continuous concave function as for the constant vector $\gamma_i$, and to any vector in the field of real numbers, $\gamma_{i1}$ and $\gamma_{i2}$ meet the following condition:

$$\Theta_i(\gamma_{i1}) - \Theta(\gamma_{i2}) \leq \frac{\partial \Theta_i}{\partial \gamma_i}(\gamma_{i2})(\gamma_{i1} - \gamma_{i2}).$$

In the method for collaborative controlling networks resilience of the present invention, the method of designing the adaptive robust controller includes steps S51~S52.

Step S51, design an adaptive law $\hat{\gamma}_i$ for estimating the constant vector $\gamma_i$ based on the constraint following error e; and the boundary function $\Theta_i(\hat{\gamma}_i, p^i, \dot{p}^i, t)$, $$\dot{\hat{\gamma}}_i = Y_{i1} \frac{\partial \Theta_i^T}{\partial \gamma_i}(\hat{\gamma}_i, p^i, \dot{p}^i, t) \|\epsilon_i\| - Y_{i2} \hat{\gamma}_i$$

In this formula, $\hat{\gamma}_i$ is the estimated value of $\gamma_i$, $\hat{\gamma}_i(t_0) > 0$. $t_0$ means the initial time. $Y_{i1}$ and $Y_{i2}$ both mean a parameter matrix with adjustable adaptive law, $Y_{i1} > 0$, $Y_{i2} > 0$.

Step S52, design an adaptive robust controller as following formulas based on the adaptive law $\hat{\gamma}_i$ and the constraint following error $\epsilon_i$:

$$\tau_i(t) = s_{i1}(p^i, \dot{p}^i, t) + s_{i2}(\hat{\gamma}_i, p^i, \dot{p}^i, t)$$
$$s_{i1}(p^i, \dot{p}^i, t) = -\kappa_i \overline{M}_i(p^i, t) A_i^T(p^i, t)[A_i(p^i, t) A_i^T(p^i, t)]^{-1} K_i^{-1} \epsilon_i(p^i, \dot{p}^i, t)$$
$$s_{i2}(\hat{\gamma}_i, p^i, \dot{p}^i, t) =$$
$$-\overline{M}_i(p^i, t) A_i^T(p^i, t)(A_i(p^i, t) A_i^T(p^i, t))^{-1} K_i^{-1} \epsilon_i(p^i, \dot{p}^i, t) \times \Theta_i^2(\hat{\gamma}_i, p^i, \dot{p}^i, t)$$

In this formula, $\kappa_i$ means a controlling and adjusting parameter which is greater than 0; $s_{i1}(p^i, \dot{p}^i, t)$ used to handle initial incompatibility problems. $s_{i2}(\hat{\gamma}_i, p^i, \dot{p}^i, t)$ is used to handle the uncertainty of system parameters and the influence of network attack input.

The method for collaborative controlling networks resilience of the present invention, further includes step S53.

Step S53, analyses the stability of the adaptive robust controller by a Lyapunov function as follows:

$$V = \sum_{i=1}^{n} V_i.$$

-continued

Wherein:

$$V_i = \frac{1}{2}\epsilon_i^T K_i \epsilon_i + \frac{1}{2}(1 + \delta_{E_i})(\hat{\gamma}_i - \gamma_i)^T Y_{i1}^{-1}(\hat{\gamma}_i - \gamma_i).$$

The method for collaborative controlling networks resilience of the present invention, further includes Step S54.

Step S54, adjust parameters of the adaptive robust controller, the parameters includes $\kappa_i$, $Y_{i1}$, $Y_{i2}$.

The present invention further provides a computer terminal, including computer programs, storage, a processor, and a processor. The storage is used for storing the computer program. The processor is used for running the stored computer programs. The computer programs are used to achieve functions according to the method for collaborative controlling networks resilience as stated in any of the above.

The present invention further provides a computer readable storage media, used to achieve functions according to the method for collaborative controlling networks resilience as stated in any of the above.

Compared with the prior art, the advantages and beneficial effects of the present invention are as follows.

The method for collaborative controlling networks resilience takes both the uncertainty of system parameters and the influence of network attack input into account to construct a dynamic model. Based on the dynamic model, an uncertainty boundary function is constructed which contains the uncertainty and the influence. A function value is adjusted adaptively to be closer to the actual boundary information using an adaptive law so that the corresponding control quantity can be used by compensating the impact of uncertainty and influence. The problem of uncertainty and influence is effectively dealt with, and the problem of cooperative control stability of unmanned cluster systems is difficult to maintain. At the same time, the unmanned cluster system can quickly and stably meet the constraint following performance requirements, strengthen the robustness and fault tolerance of cluster cooperative control, improve the reliability of cluster control and the security of task execution, and better meet the practical application requirements.

DETAILED DESCRIPTION OF PREFERRED EMBODIMENTS

The present invention will now be described more specifically with reference to the following embodiments. It is to be noted that the following descriptions of preferred embodiments of this invention are presented herein for illustration and description only. It is not intended to be exhaustive or to be limited to the precise disclosed form.

Aiming at the technical problems that the uncertainty of system parameters and the influence of network attack input are not taken into account at the same time when the collaborative control technology of unmanned cluster system is studied in the prior art, the stability of system collaborative control is difficult to maintain when the cluster is subjected to network attack. The invention introduces a method for collaborative controlling networks resilience of an unmanned cluster system. The invention also takes the uncertainty of system parameters and the influence of network attack input into account, and designs the corresponding adaptive robust controller for each unmanned system in the unmanned cluster system, which can effectively deal with the uncertainty of system parameters and the network attack input problem. It also enables the unmanned cluster system to quickly and stably meet the constraint following performance requirements and better meet the actual response use demand.

Figure 1:
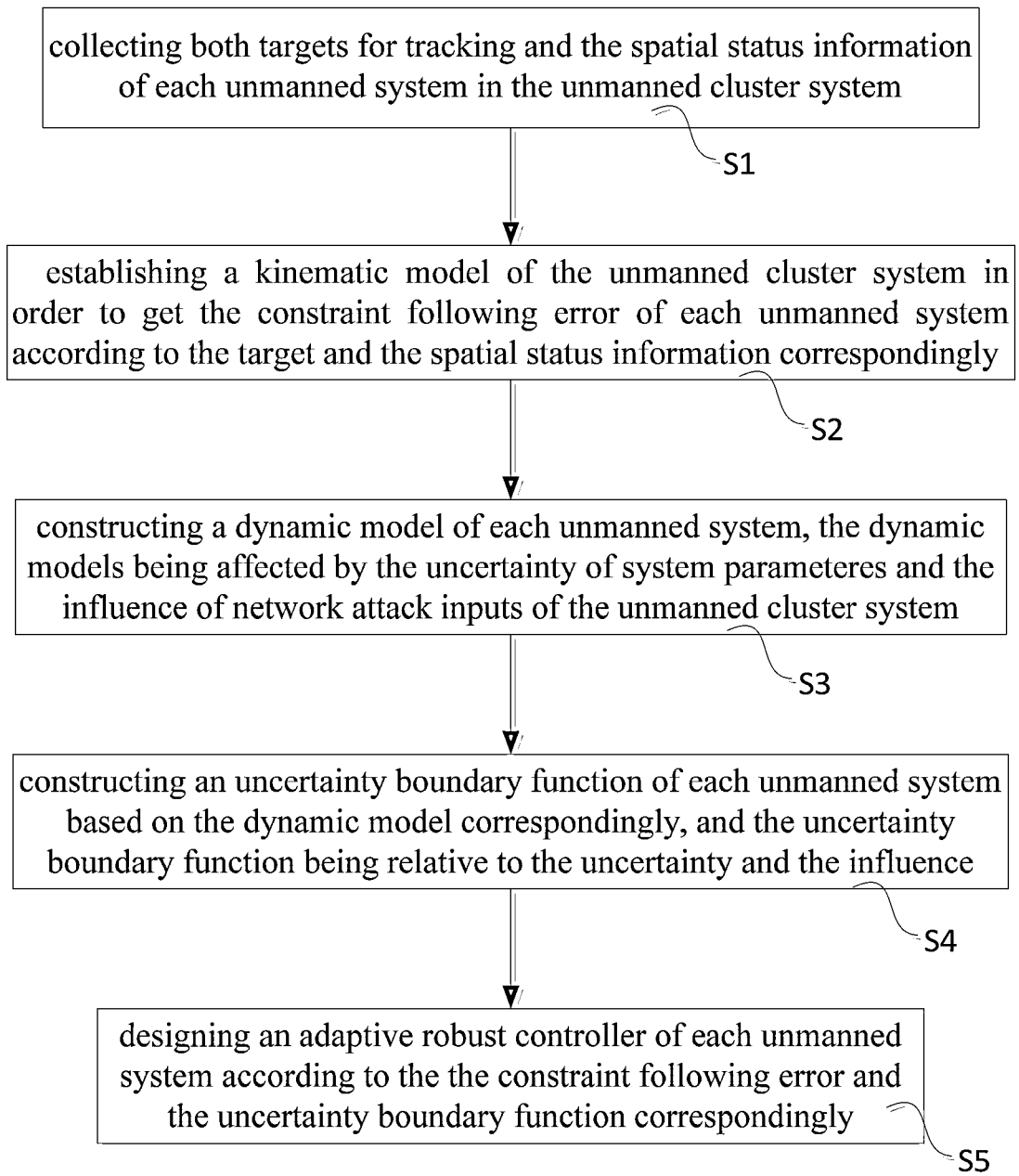
FIG. 1 is a flow diagram of a method for collaborative controlling networks resilience of an unmanned cluster system, according to the embodiment of the present invention.

Referring to FIG. 1, A method for collaborative controlling networks resilience of an unmanned cluster system includes following steps S1~S5.

Step S1, collect both targets for tracking and the spatial status information of each unmanned system in the unmanned cluster system.

The spatial status information of each target includes $p^*$ and $\dot{p}^*(t)$ also named $\dot{p}^*$. The spatial status information of the i'th unmanned system includes $p^i$ and $\dot{p}^i(t)$ also named $\dot{p}^i$, $p^i \in R^k$. $p^*$ means the spatial position of the corresponding target. $\dot{p}^*$ means the speed of the corresponding target. k means the coordinate dimension of each unmanned system. $R^k$ means k dimensional vector space in the field of real numbers.

Take unmanned vehicles as an example, the spatial position of the i'th unmanned system $p^i$ can be also named $p^i = (x_i, y_i, \varphi_i)^T$. Wherein $x_i$ means the horizontal coordinate of the i'th unmanned system. $y_i$ means the vertical coordinate of the i'th unmanned system. $\varphi_i$ means the vehicle heading angle of the i'th unmanned system.

Step S2, establish a kinematic model of the unmanned cluster system to get the constraint following error of each unmanned system according to the target and the spatial status information correspondingly. The method for getting the constraint following error includes following steps S21~S24.

Step S21, ensure a potential function $U_{ij}(\cdot)$ with regard to the i'th unmanned system and the j'th unmanned system, and solve the partial derivative of the potential function $U_{ij}(\cdot)$ according to $p^i$ and $p^j$. $p^j$ means the spatial position of the j'th unmanned system, $j \in N^+$, $N^+ = \{1, 2, \ldots, n\}$, n is the total number of unmanned systems in the unmanned cluster system.

Step S22, ensure a potential function $U_{i*}(\cdot)$ with regard to the i'th unmanned system and the corresponding target; and solve the partial derivative of the potential function $U_{i*}(\cdot)$ according to $p^i$ and $p^*$.

Step S23, establish the kinematic model of the unmanned cluster system:

$$\dot{p}^i = -\sum_{j=1, j \neq i}^{n} \frac{\partial U_{ij}}{\partial p^i}(p^i, p^j) - \frac{\partial U_{i*}}{\partial p^i}(p^i, p^*) + \dot{p}^*.$$

The kinematic model of the unmanned cluster system can be named as:

$$\begin{bmatrix} \dot{x}_i \\ \dot{y}_i \end{bmatrix} = -\sum_{j=1, j \neq i}^{n} u_{ij} - u_{i*} + \begin{bmatrix} \dot{x}_* \\ \dot{y}_* \end{bmatrix}$$

$$u_{ij} = \begin{bmatrix} x_i - x_j \\ y_i - y_j \end{bmatrix} \left( a - \frac{b}{(x_i - x_j)^2 + (y_i - y_j)^2 + c} \right)$$

$$u_{i*} = g \begin{bmatrix} x_i - x_* \\ y_i - y_* \end{bmatrix}$$

All the parameters of a, b, c, and g are positive scalar parameters.

Step S24, transform the kinematic model to a first-order constrained-differential equation with performance constrain:

$$A_i(p^i, t)\dot{p}^i = c_i(p^i, t)$$

solve the partial derivative of the first-order constrained-differential equation to a second-order standard constraint form by transposing:

$$A_i(p^i, t)\ddot{p}^i = b_i(p^i, \dot{p}^i, t)$$

Wherein:

$$A_i = \begin{bmatrix} 1 & 0 & 0 \\ 0 & 1 & 0 \end{bmatrix}$$

$$\dot{p}^i = [\dot{x}_i \ \dot{y}_i \ \dot{\varphi}_i]^T$$

$$\ddot{p}^i = [\ddot{x}_i \ \ddot{y}_i \ \ddot{\varphi}_i]^T$$

$$c_i = -\sum_{i=1}^{n} u_{ij} - u_{i*} + \begin{bmatrix} \dot{x}_* \\ \dot{y}_* \end{bmatrix}$$

$$b_i = -\sum_{i=1}^{n} \frac{\partial u_{ij}}{\partial t} - \frac{\partial u_{i*}}{\partial t} + \begin{bmatrix} \ddot{x}_* \\ \ddot{y}_* \end{bmatrix}$$

Then, get the constraint following error $\epsilon_i$:

$$\epsilon_i = A_i(p^i, t)\dot{p}^i - c_i(p^i, t)$$

In these formulas, $c_i(p^i, t)$ means the first-order constrained vector of the i'th unmanned system. $b_i(p^i, \dot{p}^i, t)$ means the second-order constrained vector of the i'th unmanned system.

The potential function $U_{ij}(\cdot)$ with regard to the kinematic model of the unmanned cluster system means the interaction force between the i'th and the j'th unmanned system. The larger the distance between the i'th and the j'th unmanned systems is, the more mutual affinity the force has. The smaller the distance between the i'th and the j'th unmanned systems is, the more mutual repulsion the force has. When the distance between the i'th and the j'th unmanned systems is in equilibrium, the acting force disappears. The potential function $U_{i*}(\cdot)$ is with regard to the i'th unmanned system and the corresponding target. The targets have some attraction with each unmanned system, then each unmanned system can be able to track the targets to get a good tracking effect. The kinematic model consisted of $U_{ij}(\cdot)$ and $U_{i*}(\cdot)$ means the best motion state of the unmanned cluster system. When the unmanned cluster system is tracking to round the targets up, the unmanned systems are always keeping a stable distance from each other to get a stable formation.

Step S3, construct a dynamic model of each unmanned system, the dynamic models are affected by the uncertainty of system parameters and the influence of network attack inputs of the unmanned cluster system. The method for constructing the dynamic model includes the following steps S31~S33.

Step S31, construct the dynamic model based on the Lagrange Modeling Approach and considered the uncertainty as follows:

$$M_i(p^i(t), \varrho_i(t), t)\ddot{p}^i(t) + C_i(p^i(t), \dot{p}^i(t), \varrho_i(t), t)\dot{p}^i(t) + G_i(p^i(t), \varrho_i(t), t) + F_i(p^i(t), \dot{p}^i(t), \varrho_i(t), t) = \tau_i(t)$$

$\varrho_i(t) \subset \Gamma_i \subset R^p$, $\Gamma_i \subset R^p$ means compact set of the unmanned cluster system. $R^p$ means p dimensional vector space in the field of real numbers. $\Gamma_i$ means the possible boundary of $\varrho_i(t)$. $\ddot{p}^i(t)$ means the accelerated speed of the i'th unmanned system also named $\ddot{p}^i$. $\mathcal{M}_i(p^i, \varrho_i, t)$ means an inertia matrix. $C_i(p^i, \dot{p}^i, \varrho_i, t)\dot{p}^i$ means the Coriolis/Centrifugal force. $G_i(p^i, \varrho_i, t)$ means the gravitational force. $F_i(p^i, \dot{p}^i, \varrho_i, t)$ means the other force. $\tau_i(t)$ meaning an input of control force. $\mathcal{M}_i(p^i, \varrho_i, t)$, $C_i(p^i, \dot{p}^i, \varrho_i, t)\dot{p}^i$, $F_i(p^i, \dot{p}^i, \varrho_i, t)$, $G_i(p^i, \varrho_i, t)$ all are exact dimensions. $M_i(\bullet)$, $C_i(\bullet)$, $G_i(\bullet)$, $F_i(\bullet)$ all are continuous function.

Step S32, reconstruct the dynamic model of the i'th unmanned system with the uncertainty of system parameters and the influence of network attack inputs as follows:

$$M_i(p^i(t), \varrho_i(t), t)\ddot{p}^i(t) + C_i(p^i(t), \dot{p}^i(t), \varrho_i(t), t)\dot{p}^i(t) + G_i(p^i(t), \varrho_i(t), t) + F_i(p^i(t), \dot{p}^i(t), \varrho_i(t), t) + D_{ai}(p^i(t), \dot{p}^i(t), t)v_{ai} = \phi_i(t)\tau_i(t)$$

$D_{ai}(p^i(t),\dot{p}^i(t),t)$ means input matrix of the network attack input of the i'th unmanned system, $v_{ai} \in \Sigma_i \subset R^l$. $\Sigma_i \subset R^l$ means compact set of the unmanned cluster system. $R^l$ means l dimensional vector space in the field of real numbers. $\Sigma_i$ means the possible boundary of $v_{ai}$. $\phi_i(t)$ means an influence coefficient for controlling the network attack input. $D_{ai}(p^i(t),\dot{p}^i(t),t)$ is an exact dimension. $D_{ai}(\bullet)$ is a continuous function.

The dynamic model of a unmanned vehicle system can be named as:

$$M_i(p^i(t), \varrho_i(t), t)\ddot{p}^i(t) + C_i(p^i(t), \dot{p}^i(t), \varrho_i(t), t)\dot{p}^i(t) + G_i(p^i(t), \varrho_i(t), t) + F_i(p^i(t), \dot{p}^i(t), \varrho_i(t), t) + D_{ai}(p^i(t), \dot{p}^i(t), t)v_{ai} = \phi_i(t)\tau_i(t)$$

$m_i$ means the quality of the unmanned vehicle. $I_i$ means the inertia matrix of the unmanned vehicle. $u_i^l$ means the control moment of the wheel in the left of the unmanned vehicle. $u_i^r$ means the control moment of the wheel in the right of the unmanned vehicle. r means the radius of each wheel. d means the distance from the centroid of the unmanned vehicle to the axial of the driving wheel of the unmanned vehicle. l means the distance from the axis of symmetry of the unmanned vehicle to the driving wheel.

Step S33, set constraint conditions to the dynamic model:
if any $(p^i,t) \in R^k \times R$, $\varrho_i \in \Gamma_i$, the inertia matrix $M_i(p^i,\varrho_i,t)$ means a positive definite matrix;

if any $(p^i,t) \in R^k \times R$ and $A_i(p^i,t)$ being full rank, the inertia matrix $A_i(p^i,t) A_i^T(p^i,t)$ is reversible;
if any $t \in R$, $\phi_i(t)$ has a lower limiting value $\bar{\phi}_i$, $\bar{\phi}_i \leq \phi_i(t) \leq 1$.

The above constraints specify the scope of application of the control method of the present invention, and only when these constraints are met can the following controller design be carried out.

Step S4, construct an uncertainty boundary function of each unmanned system based on the dynamic model correspondingly, and the uncertainty boundary function is relative to the uncertainty and the influence. The method for constructing the uncertainty boundary function includes following steps S41~S43.

Step S41, decompose the dynamic model of the i'th unmanned system as follows according to the effect on the uncertainty of system parameters:

$$\begin{cases} M_i(p^i, t) := \overline{M}_i(p^i, t) + \Delta M_i(p^i, t) \\ H_i(p^i, t) := \overline{M}_i^{-1}(p^i, t) \\ \Delta H_i(p^i, \varrho_i, t) := \overline{M}_i^{-1}(p^i, \varrho_i, t) - \overline{M}_i^{-1}(p^i, t) \\ E_i(p^i, \varrho_i, t) := \overline{M}_i(p^i, t)\overline{M}_i^{-1}(p^i, \varrho_i, t) - I \\ \Delta H_i(p^i, \varrho_i, t) := H_i(p^i, t)E_i(p^i, \varrho_i, t) \end{cases}$$

Step S42, decompose the input matrix $D_{ai}$ of the i'th unmanned system based on the network attack input as follows:

$$D_{ai} = \hat{D}_{ai} + \tilde{D}_{ai}$$

Wherein:

$$\begin{cases} \hat{D}_{ai} = (A_iH_i)^T[(A_iH_i)(A_iH_i)^T]^{-1}A_iH_iD_{ai} \\ \tilde{D}_{ai} = D_{ai} - (A_iH_i)^T[(A_iH_i)(A_iH_i)^T]^{-1}A_iH_iD_{ai} \end{cases}$$

Step S43, get the boundary function $\Theta_i(\gamma_i,p^i,\dot{p}^i,t)$ for describing the uncertainty boundary information of the uncertainty and the influence. The method of getting the boundary function $\Theta_i(\gamma_i,p^i,\dot{p}^i,t)$ includes following steps (a) and (b):

(a) design a formula with a constant vector $\gamma_i$ and the boundary function $\Theta_i(\gamma_i,p^i,\dot{p}^i,t)$ as follows:

$$\max_{\varrho_i \in \Gamma_i, v_{ai} \in \Sigma_i} \|K_iA_i(p^i, t)$$
$$[\mathcal{M}_i^{-1}(p^i, \varrho_i, t)(-C_i(p^i, \dot{p}^i, \varrho_i, t)\dot{p}^i - G_i(p^i, \varrho_i, t) - F_i(p^i, \dot{p}^i, \varrho_i, t)) - H_i(p^i, t)\hat{D}_{ai}(p^i, \dot{p}^i, t)v_{ai} - \Delta H_i(p^i, \varrho_i, t)D_{ai}(p^i, \dot{p}^i, t)v_{ai}] -$$
$$K_ib_i\| \leq (1 + \delta_{E_i})\Theta_i(\gamma_i, p^i, \dot{p}^i, t)$$

In this formula, yi means the uncertain variables of the i'th unmanned system. $K_i$ means a positive definite matrix of the i'th unmanned system. $\delta_{E_i}$ means a constant satisfying the following condition:

$$-2 < 2\delta_{E_i} \leq \min_{\varrho_i \in \Gamma_i} \lambda_{min}[\Phi_i(p^i, \varrho_i, t) + \Phi_i^T(p^i, \varrho_i, t)]$$

Wherein:

$$\Phi_i(p^i, \varrho_i, t) =$$
$$K_iA_i(p^i, t)H_i(p^i, t)E_i(p^i, \varrho_i, t)\overline{M}_i(p^i, t) \times A_i^T(p^i, t)(A_i(p^i, t)A_i^T(p^i, t))^{-1}K_i^{-1}$$

$\lambda_{min}(\cdot)$ means the minimum value of the matrix eigenvalue.

(b) the boundary function $\Theta_i(\gamma_i,p^i,\dot{p}^i,t)$ is a continuous concave function as for the constant vector $\gamma_i$. To any vector in the field of real numbers, $\gamma_{i1}$ and $\gamma_{i2}$ meets the following condition:

$$\Theta_i(\gamma_{i1}) - \Theta_i(\gamma_{i2}) \leq \frac{\partial \Theta_i}{\partial \gamma_i}(\gamma_{i2})(\gamma_{i1} - \gamma_{i2}).$$

A optional boundary function $\Theta_i(\gamma_i,p^i,\dot{p}^i,t)$ can be named as:

$$\Theta_i(\gamma_i, p^i, \dot{p}^i, t) = \gamma_i(1 + \|\dot{p}^i\|)^2$$

Step S5, design an adaptive robust controller of each unmanned system according to the constraint following error and the uncertainty boundary function correspondingly. The method of designing the adaptive robust controller includes following steps S51 and S52.

Step S51, design an adaptive law $\hat{\gamma}_i$ for estimating the constant vector $\gamma_i$ based on the constraint following error $\epsilon_i$ and the boundary function $\Theta_i(\hat{\gamma}_i,p^i,\dot{p}^i,t)$.

$$\dot{\hat{\gamma}}_i = Y_{i1}\frac{\partial \Theta_i^T}{\partial \gamma_i}(\hat{\gamma}_i, p^i, \dot{p}^i, t)\|\epsilon_i\| - Y_{i2}\hat{\gamma}_i$$

In this formula, $\hat{\gamma}_i$ is the estimated value of $\gamma_i$, $\hat{\gamma}_i(t_0)>0$. $t_0$ means the initial time. $Y_{i1}$ and $Y_{i2}$ both mean a parameter matrix with adjustable adaptive law, $Y_{i1}>0$, $Y_{i2}>0$. $\dot{p}^i$ means the speed of the i'th unmanned system.

Step S52, design an adaptive robust controller as following formulas based on the adaptive law $\hat{\gamma}_i$ and the constraint following error $\epsilon_i$:

$$\tau_i(t) = s_{i1}(p^i, \dot{p}^i, t) + s_{i2}(\hat{\gamma}_i, p^i, \dot{p}^i, t)$$
$$s_{i1}(p^i, \dot{p}^i, t) = -\kappa_i \overline{M}_i(p^i, t)A_i^T(p^i, t)[A_i(p^i, t)A_i^T(p^i, t)]^{-1}K_i^{-1}\epsilon_i(p^i, \dot{p}^i, t)$$
$$s_{i2}(\hat{\gamma}_i, p^i, \dot{p}^i, t) =$$
$$-\overline{M}_i(p^i, t)A_i^T(p^i, t)A_i(p^i, t)(A_i^T(p^i, t))^{-1}K_i^{-1}\epsilon_i(p^i, \dot{p}^i, t) \times \Theta_i^2(\hat{\gamma}_i, p^i, \dot{p}^i, t)$$

In this formula, $\kappa_i$ means a controlling and adjusting parameter which is greater than 0; $s_{i1}(p^i,\dot{p}^i,t)$ used to handle initial incompatibility problems. $s_{i2}(\hat{\gamma}_i,p^i,\dot{p}^i,t)$ is used to handle the uncertainty and the influence, and then it is ensured that the adaptive robust controller has good recovery capability under the affection of the uncertainty and the influence. $A_i(p^i,t)$ means the constraint matrix of the i'th unmanned system.

Step S53, analyse the stability of the adaptive robust controller by a Lyapunov function as follows:

$$V = \sum_{i=1}^{n} V_i$$
$$V_i = \frac{1}{2}\epsilon_i^T K_i \epsilon_i + \frac{1}{2}(1 + \delta_{E_i})(\hat{\gamma}_i - \gamma_i)^T Y_{i1}^{-1}(\hat{\gamma}_i - \gamma_i)$$

The Lyapunov function is transformed as follows:

$$\dot{V}_i \leq -\kappa_i \overline{\phi}_i(1 + \delta_{E_i})\|\epsilon_i\|^2 + \frac{1 + \delta_{E_i}}{4\overline{\phi}_i} - $$
$$(1 + \delta_{E_i})\lambda_{min}(y_{i1}^{-1}y_{i2})\|\hat{\gamma}_i - \gamma_i\|^2 + (1 + \delta_{E_i})\|y_{i1}^{-1}y_{i2}\gamma_i\|\|\hat{\gamma}_i - \gamma_i\|$$

When:

$$\hat{z}_{i1} := \min\{\kappa_i\overline{\phi}_i(1 + \delta_{E_i}), (1 + \delta_{E_i})\lambda_{min}(y_{i1}^{-1}y_{i2})\},$$
$$\hat{z}_{i2} := (1 + \delta_{E_i})\|Y_{i1}^{-1}Y_{i2}\gamma_i\|, \hat{z}_{i3} := (1 + \delta_{E_i})/(4\overline{\phi}_i), \alpha_i = [\epsilon_i^T, (\hat{\gamma}_i - \gamma_i)^T]^T,$$

then:

$$\dot{V}_i \leq -\hat{z}_{i1}\|\alpha_i\|^2 + \hat{z}_{i2}\|\alpha_i\| + \hat{z}_{i3}$$

When:

$$\hat{z}_1 = \min_{i \in N}\hat{z}_{i1}, \hat{z}_2 = \max_{i \in N}\hat{z}_{i2}, \hat{z}_3 = \max_{i \in N}\hat{z}_{i3}, \alpha = [\alpha_1^T, \alpha_2^T, \ldots, \alpha_n^T]^T,$$

then:

$$\dot{V} = \sum_{i=1}^{n}\dot{V}_i \leq -\hat{z}_1\|\alpha\|^2 + n\hat{z}_2\|\alpha\| + n\hat{z}_3$$

When:

$$\hat{\rho}_{i1} := \frac{1}{2}\min_{i \in N}\{\lambda_{min}(K_i), (1 + \delta_{E_i})\lambda_{min}(y_{i1}^{-1})\}$$
$$\hat{\rho}_{i2} := \frac{1}{2}\max_{i \in N}\{\lambda_{max}(K_i), (1 + \delta_{E_i})\lambda_{max}(y_{i1}^{-1})\}$$

$\lambda_{min}(K_i)$ is thhe minimum value of the $K_i$, and $\lambda_{min}(Y_{i1}^{-1})$ is the minimum value of the $Y_{i1}^{-1}$.

$$\hat{\rho}_{i1}\|\alpha_i\|^2 \leq V_i \leq \hat{\rho}_{i2}\|\alpha_i\|^2$$

When:

$$\hat{\rho}_1 = \min_{i \in N}\{\hat{\rho}_{i1}\}, \hat{\rho}_2 = \max_{i \in N}\{\hat{\rho}_{i2}\},$$

then:

$$\hat{\rho}_1\|\alpha\|^2 \leq V \leq \hat{\rho}_2\|\alpha\|^2.$$

The ultimate boundedness is shown as follow:

$$d(r) = \begin{cases} \sqrt{\frac{\hat{\rho}_2}{\hat{\rho}_1}}R, & \text{if } r \leq R \\ \sqrt{\frac{\hat{\rho}_2}{\hat{\rho}_1}}r, & \text{if } r > R \end{cases}$$

$$R = \frac{n\hat{z}_2 + \sqrt{n^2\hat{z}_2^2 + 4n\hat{z}_1\hat{z}_3}}{2\hat{z}_1}$$

$$\underline{d} = \sqrt{\frac{\hat{\rho}_2}{\hat{\rho}_1}}R,$$

$\underline{d}$ means the lower limiting value of a uniform final stable bound.

The uniform ultimate boundedness is shown as follow:

$$T(\bar{d}, r) = \begin{cases} 0, & \text{if } r \leq \bar{R} \\ \dfrac{\hat{\rho}_2 r^2 - \hat{\rho}_1 \bar{R}^2}{\hat{z}_1 \bar{R}^2 - n\hat{z}_2 \bar{R} - n\hat{z}_3} & \text{if } r > \bar{R} \end{cases}$$

$$\bar{R} = \sqrt{\dfrac{\hat{\rho}_1}{\hat{\rho}_2}}\, \bar{d},$$

r means initial conditions. $\bar{d}$ means a positive number greater than $\underline{d}$.

It can be seen that the consistent boundedness and consistent ultimate boundedness of the unmanned cluster system control can be guaranteed, thereby ensuring the elasticity and stability of cluster control in the presence of system uncertainty and network attack inputs.

Step S54, adjust the parameters of the adaptive robust controller. The adaptive robust controller achieves the desired control effect, thereby achieving collaborative control of unmanned cluster systems under network attack interference.

The parameters include $\kappa_i$, $Y_{i1}$, $Y_{i2}$. Specifically, simulation software can be used to conduct simulation experiments on the system control performance, analyzing whether the system performance and constraint following error meet the expected requirements. If the requirements are met, the controller design is completed. If the requirements are not met, it is necessary to continue adjusting the parameters until the control effect meets the expected requirements.

Select an unmanned cluster system consisting of six unmanned vehicles as the simulation object, and conduct simulation experiments on its control performance using simulation software.

First, set simulation parameters.

Parameters of the kinematic model can be selected as a=0.01, b=30, c=1, g=5.

Parameters of the dynamic model can be selected as $m_i$=20+0.4 sin(t), $I_i$=10+0.2 sin(t), r=0.125, l=0.3, d=0.2.

Parameters of the network attack can be selected as $D_{ai}$=0.2$I_{3\times3}$, $\phi_i$=0.8+0.2 sign(sin(t)). $I_{3\times3}$ is a third order identity matrix.

The network attack inputs can be selected as $$v_{a1} = \begin{bmatrix} \sin(t) \\ \cos(t) \\ \sin(2t) \end{bmatrix}, v_{a2} = \begin{bmatrix} \cos(t) \\ \sin(t+1) \\ \sin(3t) \end{bmatrix}, v_{a3} = \begin{bmatrix} \sin(2t) \\ \cos(1.5t) \\ \sin(t) \end{bmatrix},$$

$$v_{a4} = \begin{bmatrix} \cos(2t) \\ \sin(2t) \\ \sin(3t) \end{bmatrix}, v_{a5} = \begin{bmatrix} \sin(t) \\ \cos(t) \\ \sin(0.5t) \end{bmatrix}, v_{a6} = \begin{bmatrix} \cos(3t) \\ \sin(t) \\ \sin(1.5t) \end{bmatrix}$$

Figure 2:
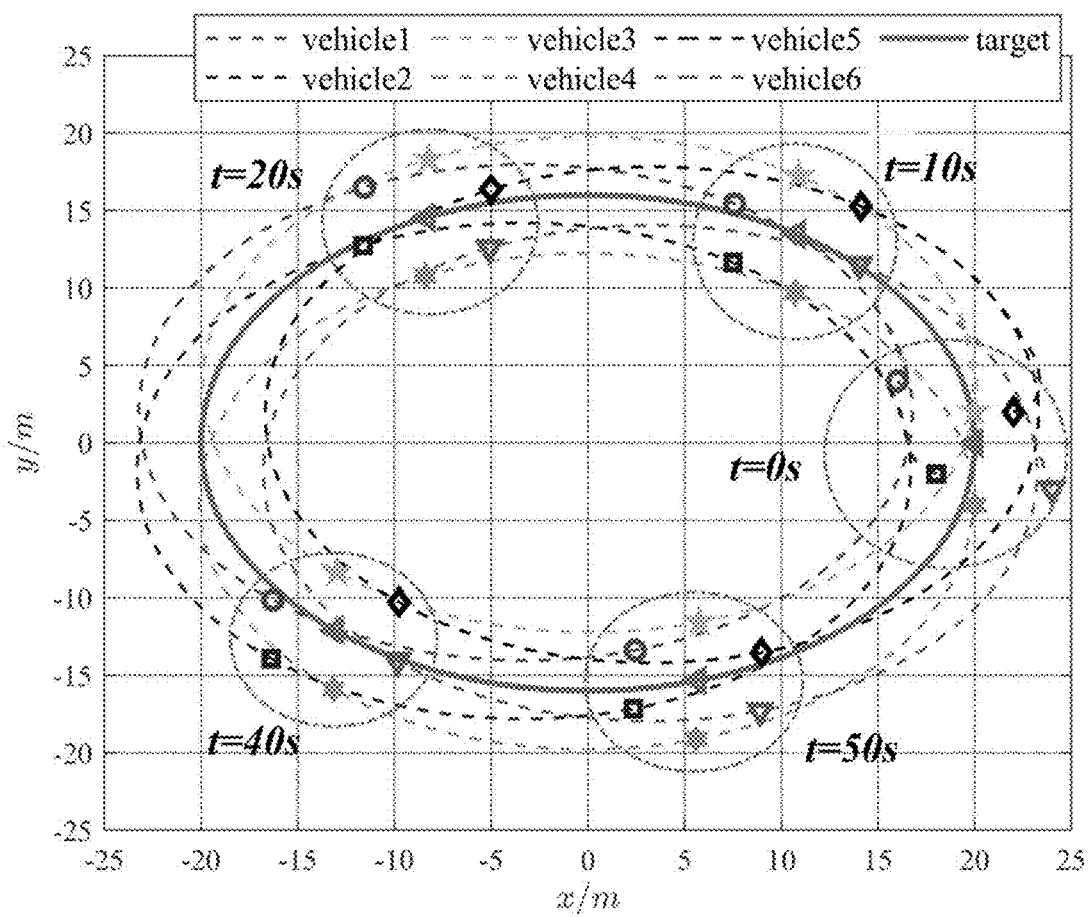
FIG. 2 is a locus diagram of agents of the unmanned cluster system having six unmanned systems, suffering from network attacks and being under control of the method.

FIG. 2 shows the simulation trajectory obtained by the unmanned cluster system under network attack by applying control tracking to capture and track the target. It can be seen from FIG. 2 that the cluster as a whole can stably track and capture the tracking target, achieving the expected effect.

Figure 3:
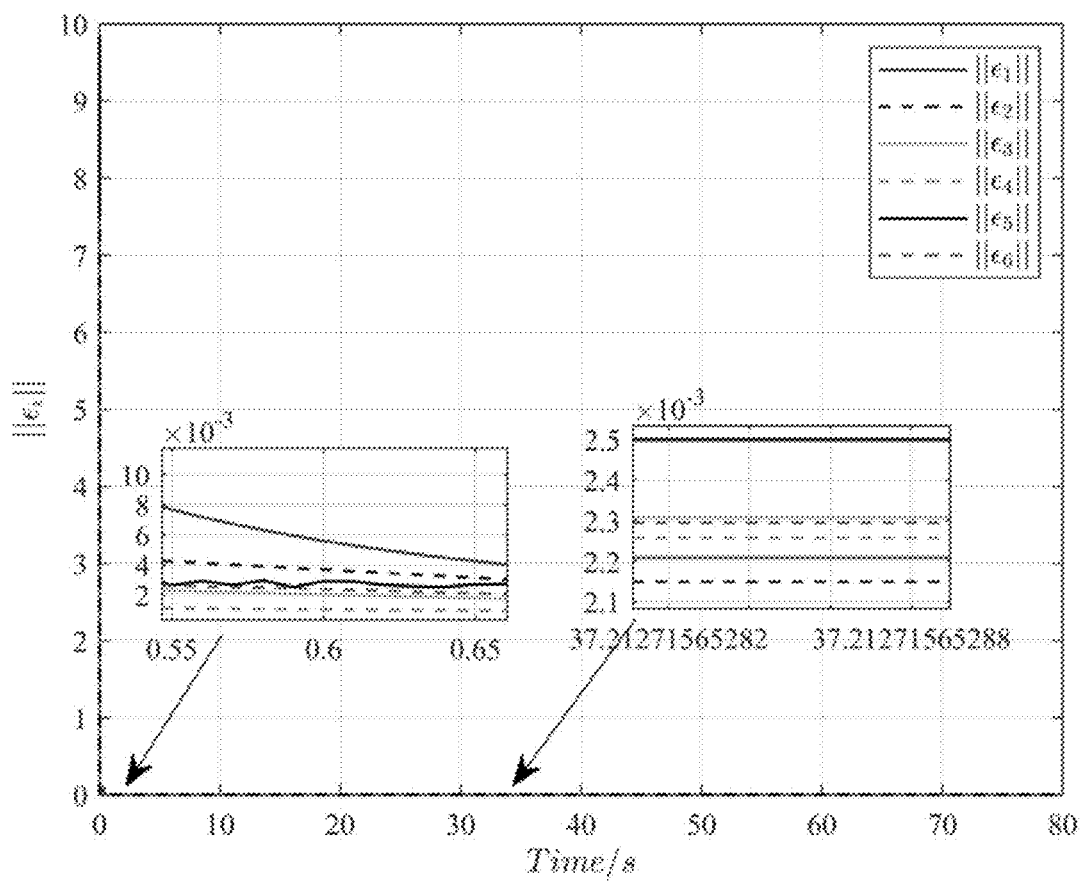
FIG. 3 is a trajectory chart of the constraint following error of the unmanned cluster system.

FIG. 3 shows the trajectory of the constraint following error of the cluster system over time. It can be seen that the constraint following error of the cluster system converges quickly to zero, indicating that the adaptive robust control instrument designed in this embodiment has good control performance in the presence of parameter uncertainty and network attacks. It can effectively handle system parameter uncertainty and network attack input problems.

Figure 4:
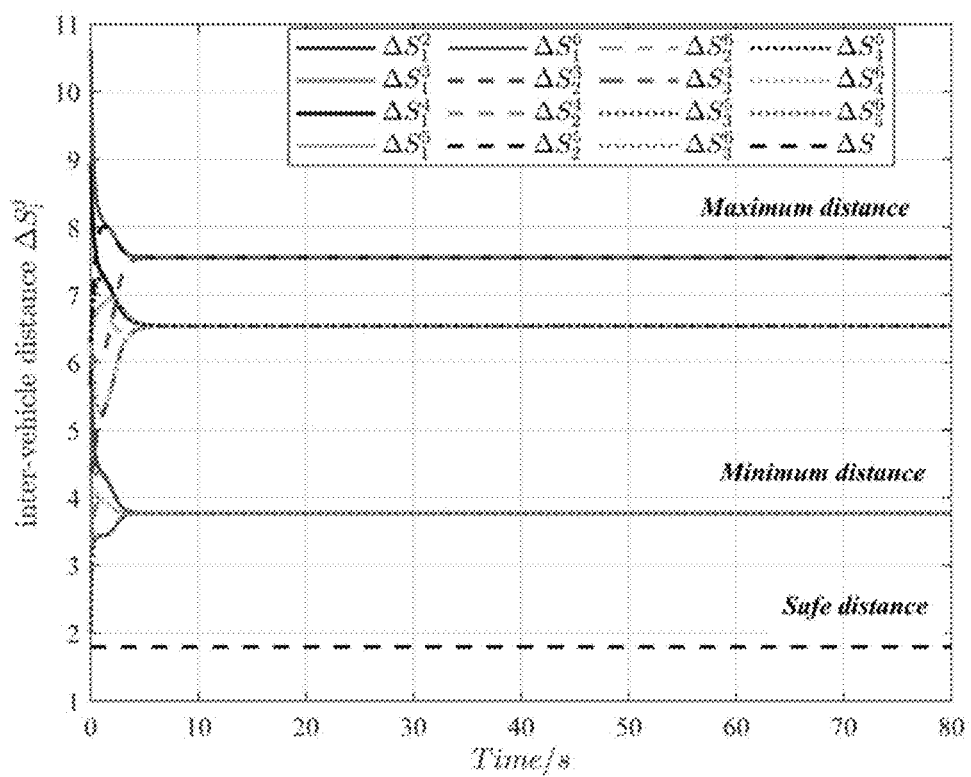
FIG. 4 is a trajectory chart of distances between each two unmanned systems in the unmanned cluster system.
Figure 5:
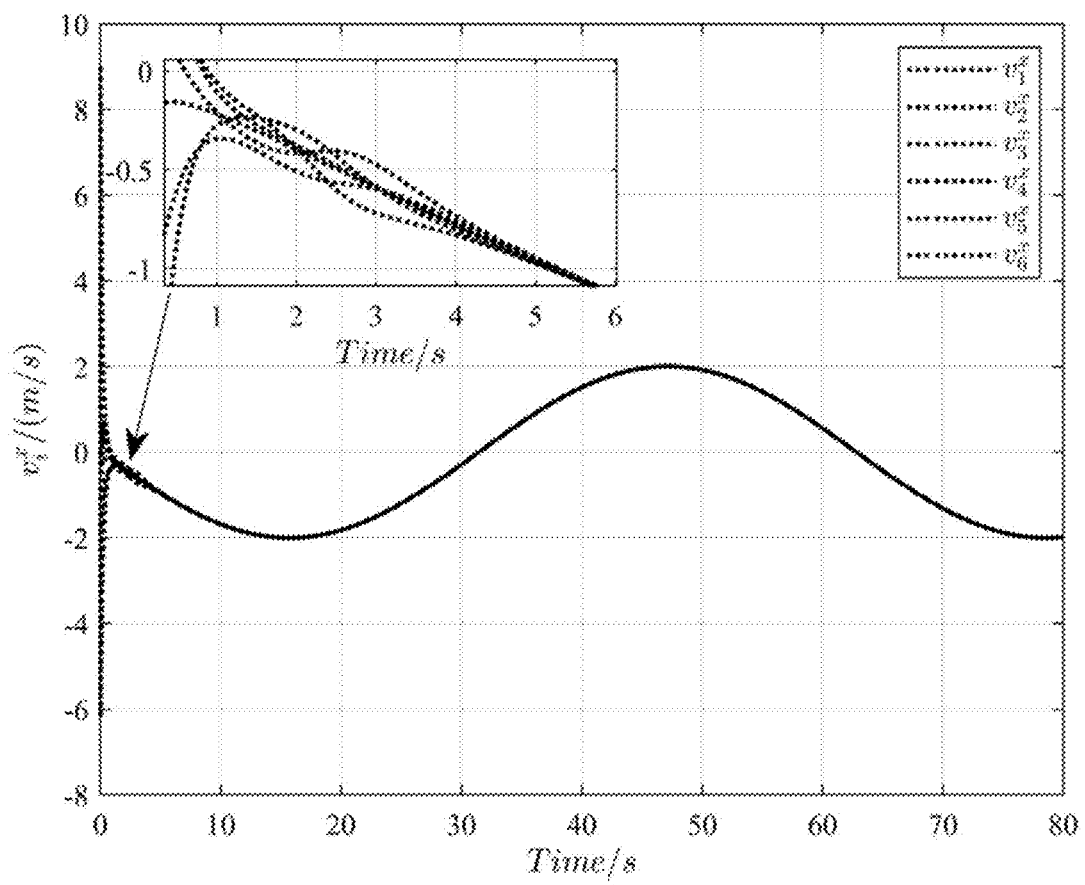
FIG. 5 is a trajectory chart of speeds in the X direction of all unmanned systems in the unmanned cluster system.
Figure 6:
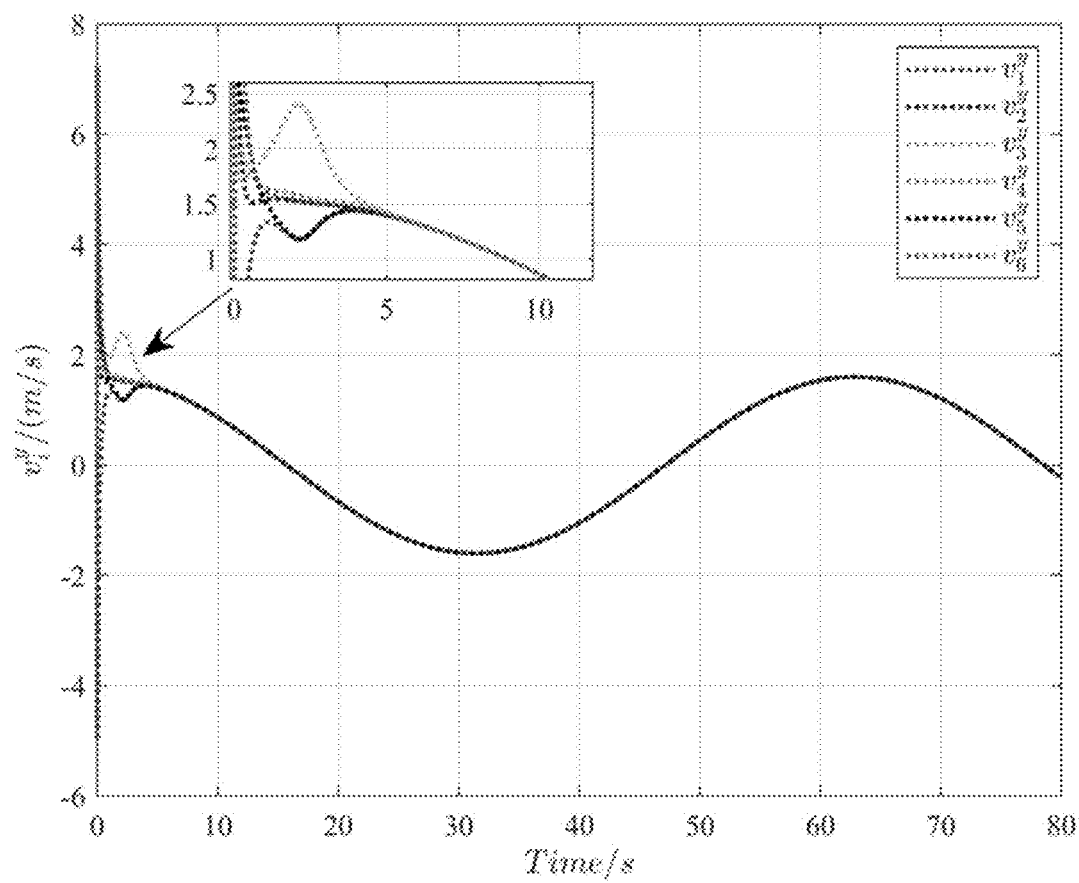
FIG. 6 is a trajectory chart of speeds in the Y direction of all unmanned systems in the unmanned cluster system.

FIG. 4 shows the trajectory diagram of the distance between each unmanned vehicle in the cluster system over time. FIG. 5 shows the trajectory diagram of the X-direction (lateral) velocity of each unmanned vehicle in the cluster system over time. FIG. 6 shows the trajectory diagram of the Y-direction (longitudinal) velocity of each unmanned vehicle in the cluster system over time. It can be seen that the unmanned workshop in the cluster can reach a steady-state value within a distance of 10 seconds and can also form a stable formation under network attacks. The speed of each unmanned vehicle also quickly converges, and makes the overall movement of the cluster more stable.

Figure 7:
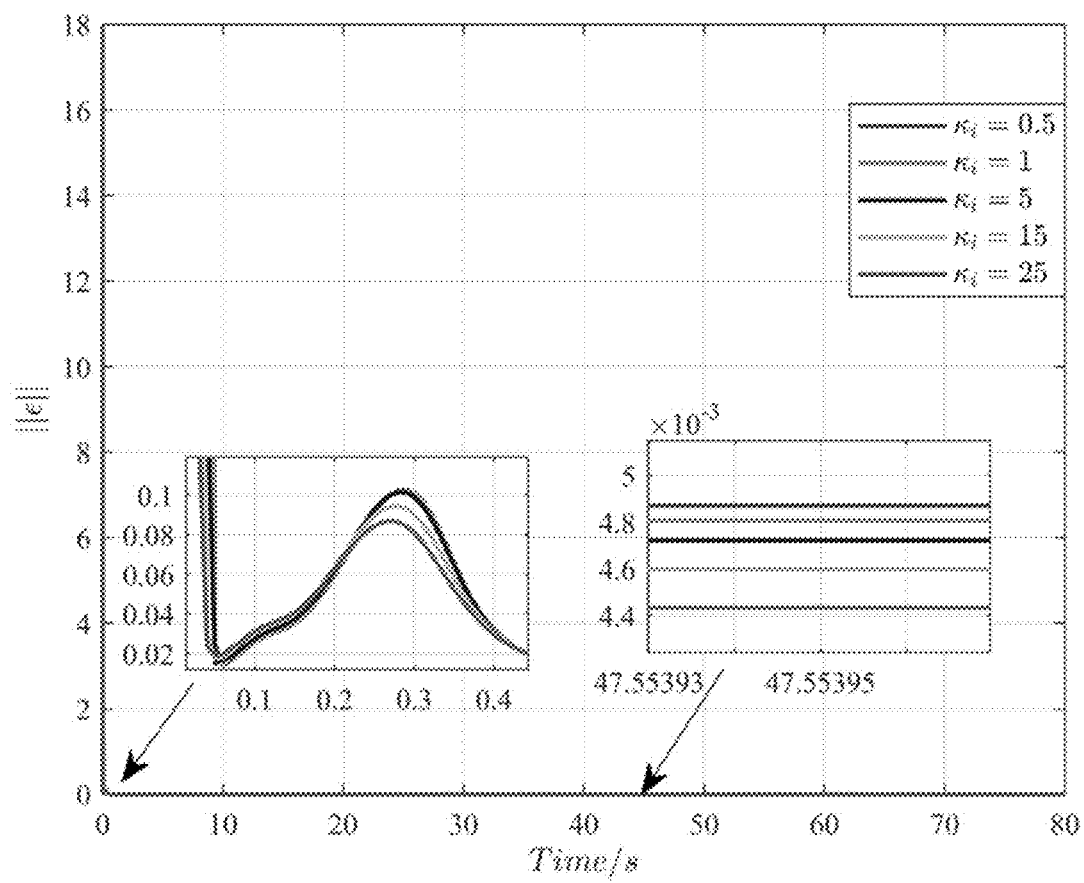
FIG. 7 is a trajectory chart of the integral control error $\|\epsilon\|$ under different control parameters $\kappa_i$.
Figure 8:
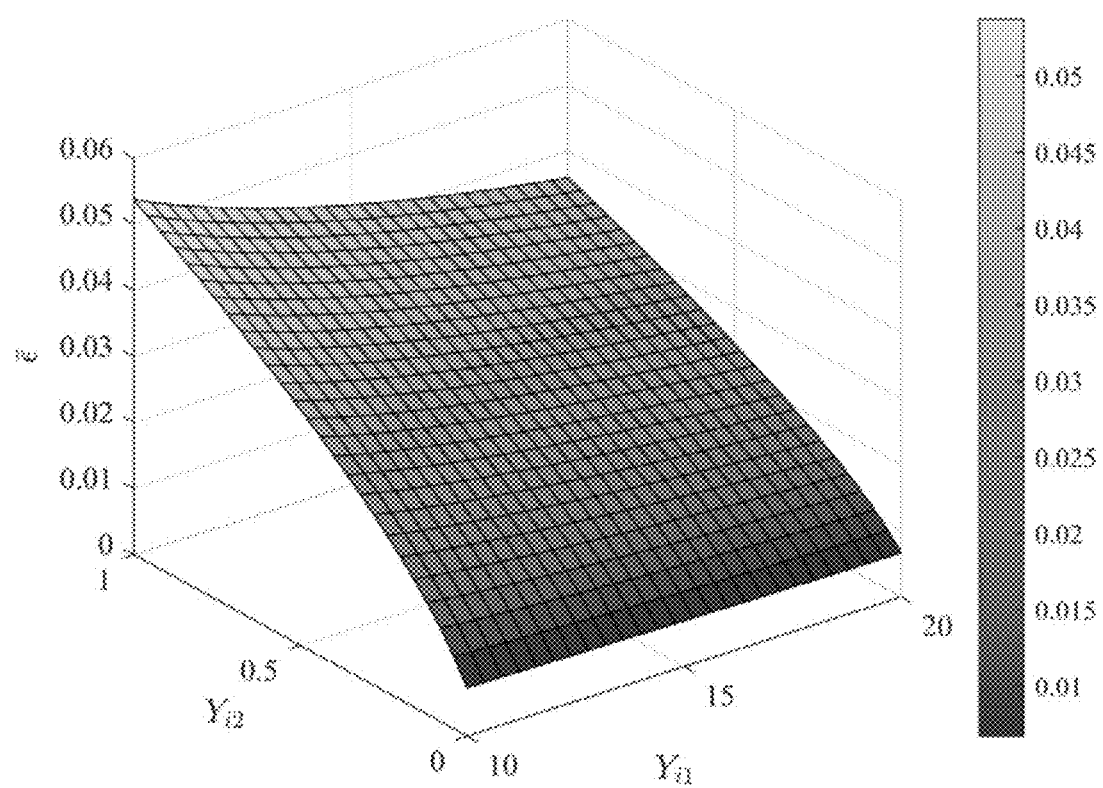
FIG. 8 is a distribution diagram of the average control error $\bar{\epsilon}$ under parameter matrices with different adjustable adaptive law.

FIG. 7 is a trajectory chart of the integral control error $\|\epsilon\|$ under difference control parameters $\kappa_i$. $\epsilon$ means $\epsilon=[\epsilon_1^T, \epsilon_2^T, \epsilon_3^T, \epsilon_4^T, \epsilon_5^T, \epsilon_6^T]^T$. From FIG. 7, it can be seen that different $\kappa$ The control effect of i may vary to a certain extent, with larger values $\kappa$ I have better control effect. But correspondingly, it will require greater control force input and control parameters can be adjusted according to actual needs. FIG. 8 is a distribution diagram of the average control error $\bar{\epsilon}$ under different parameter matrixes with different adjustable adaptive laws such as $Y_{i1}$ and $Y_{i2}$. $\bar{\epsilon}$ means $\bar{\epsilon}=(\int_0^T \epsilon(t)dt)/T$. T means the total time for controlling. From FIG. 8, it can be seen that the selection of the adaptive law adjustment parameter matrix $Y_{i1}$ and $Y_{i2}$ will comprehensively affect the control effect to a certain extent, and parameter adjustment can be carried out according to the actual control accuracy requirements. The specific selection of these parameter values can be determined by the application based on the actual task control accuracy requirements. A more effective control parameter can be selected as $\kappa$ I=0.5, Yi1=10, Yi2=0.1.

In practical applications, it is not limited to the unmanned vehicle system in the embodiments. All homogeneous or heterogeneous clusters correspond to unmanned systems, including unmanned vehicles, unmanned ships, unmanned aerial vehicles, etc., can use the control method corresponding to the present invention.

On the basis of the above-mentioned collaborative control method for unmanned cluster systems to resist network attacks, this embodiment also introduces a computer terminal. Computer terminals include memory, processors, and computer programs stored in memory that can run on the processor. The steps of implementing the collaborative control method for unmanned cluster systems to resist network attacks when the processor executes the program. When applied, the control method can be applied in the form of software. Design the control method as an independent program and install it on the computer terminal. Computer terminals can be computers, smartphones, etc. The control method can also be designed as an embedded program that can be installed on a computer terminal, such as on a microcontroller.

On the basis of the above-mentioned collaborative control method for unmanned cluster systems to resist network attacks, this embodiment also introduces a computer-readable storage medium. The steps for implementing a collaborative control method for unmanned cluster systems against network attacks when computer programs are stored on the storage medium and executed by the processor. The control method can be applied in the form of software, such as programs designed as computer-readable storage media that can run independently. The computer-readable storage medium can be a USB flash drive. The storage medium is designed as a USB flash drive, which is used to initiate the entire method program through external triggering.

The various technical features of the above embodiments can be combined in any way. To make the description concise, all possible combinations of the various technical features in the above embodiments have not been described. However, as long as there is no contradiction in the combination of these technical features, they should be considered within the scope of this specification.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An unmanned cluster system comprising a plurality of unmanned systems and a computer terminal, wherein the computer terminal comprises a processor and storage storing computer programs to be executed by the processor, and the computer programs are for:

step S1, collecting both targets for tracking and spatial status information of each unmanned system in the unmanned cluster system;

step S2, establishing a kinematic model of the unmanned cluster system in order to get a constraint following error of each unmanned system according to the target and the spatial status information correspondingly;

step S3, constructing a dynamic model of each unmanned system, the dynamic models being affected by an uncertainty of system parameters and an influence of network attack inputs of the unmanned cluster system;

step S4, constructing an uncertainty boundary function of each unmanned system based on the dynamic model correspondingly, and the uncertainty boundary function being relative to the uncertainty and the influence; and step S5, constructing an adaptive robust controller of each unmanned system according to the constraint following error and the uncertainty boundary function correspondingly;

wherein the step for constructing the uncertainty boundary function comprises:

step S41, decomposing the dynamic model of an i'th unmanned system as follows according to an effect on the uncertainty of system parameters:

$$\begin{cases} M_i(p^i, t) := \overline{M}_i(p^i, t) + \Delta M_i(p^i, t) \\ H_i(p^i, t) := \overline{M}_i^{-1}(p^i, t) \\ \Delta H_i(p^i, \varrho_i, t) := M_i^{-1}(p^i, \varrho_i, t) - \overline{M}_i^{-1}(p^i, t) \\ E_i(p^i, \varrho_i, t) := \overline{M}_i(p^i, t) M_i^{-1}(p^i, \varrho_i, t) - I \\ \Delta H_i(p^i, \varrho_i, t) := H_i(p^i, t) E_i(p^i, \varrho_i, t) \end{cases}$$

in these formulas, $\mathcal{M}_i$ being defined as a nominal part and the $\Delta \mathcal{M}_i(p^i,t)$ being defined as an uncertain part; $\mathcal{M}_i(p^i,\varrho_i,t)$ meaning an inertia matrix of the i'th unmanned system; each of $H_i$, $\Delta H_i$, and $E_i$ being defined as an alegbraic quantity; i meaning a sequence number of the unmanned system on the unmanned cluster system, $i \in N^+$, $N^+ = \{1, 2, \ldots, n\}$; n meaning a total number of the unmanned systems; $p^i$ meaning a spatial position of the i'th unmanned system; t meaning time; $\varrho_i$ meaning the uncertainty of system parameters of the i'th unmanned system;

step S42, decomposing an input matrix $D_{ai}$ of the i'th unmanned system based on the network attack input as follows:

$$D_{ai} = \hat{D}_{ai} + \tilde{D}_{ai}$$

in this formula, $$\begin{cases} \hat{D}_{ai} = (A_i H_i)^T \left[ (A_i H_i)(A_i H_i)^T \right]^{-1} A_i H_i D_{ai} \\ \tilde{D}_{ai} = D_{ai} - (A_i H_i)^T \left[ (A_i H_i)(A_i H_i)^T \right]^{-1} A_i H_i D_{ai} \end{cases};$$

$A_i$ meaning a constrain matrix; and step S43, getting a boundary function $\Theta_i(\gamma_i, p^i, \dot{p}^i, t)$ for describing uncertainty boundary information of the uncertainty and the influence, the step of getting the boundary function $\Theta_i(\gamma_i, p^i, \dot{p}^i, t)$ comprising:

(a) constructing a formula with a constant vector $\gamma_i$ and the boundary function $\Theta_i(\gamma_i, p^i, \dot{p}^i, t)$ as follows:

$$\max_{\varrho_i \in \Gamma_i, v_{ai} \in \Sigma_i} \| K_i A_i(p^i,$$
$$t)[M_i^{-1}(p^i, \varrho_i, t)(-C_i(p^i, \dot{p}^i, \varrho_i, t)\dot{p}^i - G_i(p^i, \varrho_i, t) - F_i(p^i, \dot{p}^i, \varrho_i, t)) -$$
$$H_i(p^i, t)\hat{D}_{ai}(p^i, \dot{p}^i, t)v_{ai} - \Delta H_i(p^i, t)D_{ai}(p^i, \dot{p}^i, t)v_{ai}] -$$
$$K_i b_i \| \le (1 + \delta_{E_i})\Theta_i(\gamma_i, p^i, \dot{p}^i, t)$$

in this formula, $\gamma_i$ meaning uncertain variables of the i'th unmanned system, $K_i$ meaning a positive definite matrix of the i'th unmanned system, $b_i$ meaning a second-order constrained vector of the i'th unmanned system; $v_{ai}$ meaning the network attack input of the i'th unmanned system, $v_{ai} \in \Sigma_i \subset R^l$, $\Sigma_i \subset R^l$ meaning a compact set of the unmanned cluster system, $R^l$ meaning l dimensional vector space in a field of real numbers, $\Sigma_i$ meaning a possible boundary of $v_{ai}$; $\varrho_i(t)$ meaning the uncertainty of system parameters of the i'th unmanned system, $\varrho_i(t) \subset \Gamma_i \subset R^p$, $R^p$ meaning p dimensional vector space in the field of real numbers, $\Gamma_i$ meaning a possible boundary of $\varrho_i(t)$; $C_i(p^i,\dot{p}^i,\varrho_i,t)\dot{p}^i$ meaning a Coriolis/Centrifugal force; $G_i(p^i,\varrho_i,t)$ meaning a gravitational force; $F_i(p^i,\dot{p}^i,\varrho_i,t)$ meaning the other force; $\delta_{E_i}$ meaning a constant satisfying the following condition:

$$-2 < 2\delta_{E_i} \le \min_{\varrho_i \in \Gamma_i} \lambda_{min}[\phi_i(p^i, \varrho_i, t) + \phi_i^T(p^i, \varrho_i, t)],$$

in this formula, $$\Phi_i(p^i, \varrho_i, t) =$$
$$K_i A_i(p^i, t)H_i(p^i, t)E_i(p^i, \varrho_i, t)\overline{M}_i(p^i, t) \times A_i^T(p^i, t)(A_i(p^i, t)A_i^T(p^i, t))^{-1} K_i^{-1},$$

$\lambda_{min}(\bullet)$ meaning a minimum value of a matrix eigenvalue; and (b) the boundary function $\Theta_i(\gamma_i, p^i, \dot{p}^i, t)$ being a continuous concave function as for the constant vector $\gamma_i$, and to any vector in the field of real numbers, $\gamma_{i1}$ and $\gamma_{i2}$ meeting the following condition:

$$\Theta_i(\gamma_{i1}) - \Theta_i(\gamma_{i2}) \le \frac{\partial \Theta_i}{\partial \gamma_i}(\gamma_{i2})(\gamma_{i1} - \gamma_{i2});$$

wherein the step of constructing the adaptive robust controller comprises:

step S51, constructing an adaptive law $\hat{\gamma}_i$ for estimating the constant vector $\gamma_i$ based on the constraint following error $\epsilon_i$ and the boundary function $\Theta_i(\hat{\gamma}_i, p^i, \dot{p}^i, t)$, $$\dot{\hat{\gamma}}_i = Y_{i1} \frac{\partial \Theta_i^T}{\partial \gamma_i}(\hat{\gamma}_i, p^i, \dot{p}^i, t)\|\epsilon_i\| - Y_{i2}\hat{\gamma}_i$$

in this formula, $\hat{\gamma}_i$ being an estimated value of $\gamma_i$, $\hat{\gamma}_i(t_0) > 0$, $t_0$ meaning an initial time; $Y_{i1}$ and $Y_{i2}$ both meaning a parameter matrix with adjustable adaptive law, $Y_{i1} > 0$, $Y_{i2} > 0$, $\dot{p}^i$ meaning a speed of the i'th unmanned system;

step S52, constructing an adaptive robust controller as following formulas based on the adaptive law[|\$] \$´\$\$[|\$]\$´AṔ[|\$]\$´gǵ$_i$ and the constraint following error $\epsilon_i$:

$$\tau_i(t) = s_{i1}(p^i, \dot{p}^i, t) + s_{i2}(\hat{\gamma}_i, p^i, \dot{p}^i, t)$$

$$s_{i1}(p^i, \dot{p}^i, t) = -\kappa_i \overline{\mathcal{M}}_i(p^i, t) A_i^T(p^i, t)[A_i(p^i, t)A_i^T(p^i, t)]^{-1} K_i^{-1} \epsilon_i(p^i, \dot{p}^i, t)$$

$$s_{i2}(\hat{\gamma}_i, p^i, \dot{p}^i, t) =$$
$$-\overline{\mathcal{M}}_i(p^i, t) A_i^T(p^i, t)(A_i(p^i, t)A_i^T(p^i, t))^{-1} K_i^{-1} \epsilon_i(p^i, \dot{p}^i, t) \times \Theta_i^2(\hat{\gamma}_i, p^i, \dot{p}^i, t)$$

in this formula, $\kappa_i$ meaning a controlling and adjusting parameter which is greater than 0; $s_{i1}(p^i,\dot{p}^i,t)$ used to handle initial incompatibility problems; $s_{i2}(\hat{\gamma}_i,p^i,\dot{p}^i,t)$ used to handle the uncertainty and the influence; $A_i(p^i,t)$ meaning the constrain matrix of the i'th unmanned system; and step S6, controlling the plurality of unmanned systems using the constructed adaptive robust controller.

2. The unmanned cluster system according to claim 1, wherein in step S1, the spatial status information of each target comprises $p^*$ and $\dot{p}^*(t)$ also named $\dot{p}^*$, $p^*$ meaning a spatial position of the corresponding target, $\dot{p}^*$ meaning a speed of the corresponding target; the spatial status information of each unmanned system comprises $p^i$ and $\dot{p}^i(t)$ also named $\dot{p}^i$, $p^i \in R^k$, k meaning a coordinate dimension of each unmanned system, $R^k$ meaning k dimensional vector space in the field of real numbers.

3. The unmanned cluster system according to claim 2, wherein the step for getting the constraint following error comprises:

step S21, ensuring a potential function $U_{ij}(\cdot)$ with regard to the i'th unmanned system and a j'th unmanned system, and solving a partial derivative of the potential function $U_{ij}(\cdot)$ according to $p^i$ and $p^j$, $p^j$ meaning a spatial position of the j'th unmanned system, $j \in N^+$;

step S22, ensuring a potential function $U_{i*}(\cdot)$ with regard to the i'th unmanned system and the corresponding target; and solving a partial derivative of the potential function $U_{i*}(\cdot)$ according to $p^i$ and $p^*$;

step S23, establishing the kinematic model of the unmanned cluster system:

$$\dot{p}^i = -\sum_{j=1, j\ne i}^{n} \frac{\partial U_{ij}}{\partial p^i}(p^i, p^j) - \frac{\partial U_{i*}}{\partial p^i}(p^i, p^*) + \dot{p}^*$$

step S24, transforming the kinematic model to a first-order constrained-differential equation with performance constraint:

$$A_i(p^i, t)\dot{p}^i = c_i(p^i, t),$$

solving a partial derivative of the first-order constrained-differential equation to a second-order standard constraint form by transposing:

$$A_i(p^i, t)\ddot{p}^i = b_i(p^i, \dot{p}^i, t);$$

then, getting the constraint following error $\epsilon_i$:

$$\epsilon_i = A_i(p^i, t)\dot{p}^i - c_i(p^i, t)$$

in these formulas, $c_i(p^i,t)$ meaning a first-order constrained vector of the i'th unmanned system, $b_i(p^i,\dot{p}^i,t)$ meaning a second-order constrained vector of the i'th unmanned system.

4. The unmanned cluster system according to claim 3, wherein the step for constructing the dynamic model comprises:

step S31, constructing the dynamic model as follows:

$$M_i(p^i(t), \varrho_i(t), t)\ddot{p}^i(t) + C_i(p^i(t), \dot{p}^i(t), \varrho_i(t), t)\dot{p}^i(t) +$$
$$G_i(p^i(t), \varrho_i(t), t) + F_i(p^i(t), \dot{p}^i(t), \varrho_i(t), t) = \tau_i(t)$$

$\ddot{p}^i(t)$ meaning an accelerated speed of the i'th unmanned system also named $\ddot{p}^i$; $\tau_i(t)$ meaning an input of control force; $\mathcal{M}_i(p^i, \varrho_i, t)$, $C_i(p^i, \dot{p}^i, \varrho_i, t)\dot{p}^i$, $F_i(p^i, \dot{p}^i, \varrho_i, t)$, $G_i(p^i, \varrho_i, t)$, all being exact dimensions; $M_i(\cdot)$, $C_i(\cdot)$, $G_i(\cdot)$, $F_i(\cdot)$ all being continuous function;

step S32, reconstructing the dynamic model as follows:

$$M_i(p^i(t), \varrho_i(t), t)\ddot{p}^i(t) + C_i(p^i(t), \dot{p}^i(t), \varrho_i(t), t)\dot{p}^i(t) + G_i(p^i(t), \varrho_i(t), t) +$$
$$F_i(p^i(t), \dot{p}^i(t), \varrho_i(t), t) + D_{ai}(p^i(t), \dot{p}^i(t), t)v_{ai} = \phi_i(t)\tau_i(t)$$

$D_{ai}(p^i(t), \dot{p}^i(t),t)$ meaning input matrix of the network attack input of the i'th unmanned system, $\phi_i(t)$ meaning an influence coefficient for controlling the network attack input; $D_{ai}(p^i(t),\dot{p}^i(t),t)$ being an exact dimension; $D_{ai}(\cdot)$ being a continuous function;

step S33, setting constraint conditions to the dynamic model:

if any $(p^i,t)$ being $(p^o,t) \in R^k \times R$, $\varrho_i \in \Gamma_i$, the inertia matrix $M_i(p^i, \varrho_i, t)$ meaning a positive definite matrix;

if any $(p^i,t)$ being $(p^i,)\in R^k \times R$ and $A_i(p^i,t)$ being full rank, the inertia matrix $A_i(p^i,t) A_i^T(p^i,t)$ being reversible;

if any t being $t\in R$, $\phi_i(t)$ having a lower limiting value $\bar{\phi}_i$, $\bar{\phi}_i \le \phi_i(t) \le 1$.

5. The unmanned cluster system according to claim 1, further comprising:

Step S53, analyzing a stability of the adaptive robust controller by a Lyapunov function as follows:

$$V = \sum_{i=1}^{n} V_i$$

$$V_i = \frac{1}{2}\epsilon_i^T K_i \epsilon_i + \frac{1}{2}(1+\delta_{E_i})(\hat{\gamma}_i - \gamma_i)^T Y_{i1}^{-1}(\hat{\gamma}_i - \gamma_i).$$

6. The unmanned cluster system according to claim 1, wherein the step of constructing the adaptive robust controller further comprises:

step S54, adjusting parameters of the adaptive robust controller, the parameters comprising $\kappa_i$, $Y_{i1}$, $Y_{i2}$.

7. The unmanned cluster system according to claim 1, wherein each unmanned system is selected from a group consisting of an unmanned vehicle, an unmanned ship, and an unmanned aerial vehicle.

8. A non-transitory readable computer storage media, storing computer programs, wherein the computer programs, when executed by a processor, achieve collaborative controlling networks resilience of an unmanned cluster system, the computer programs comprises instructions for:

step S1, collecting both targets for tracking and spatial status information of each unmanned system in the unmanned cluster system;

step S2, establishing a kinematic model of the unmanned cluster system in order to get a constraint following error of each unmanned system according to the target and the spatial status information correspondingly;

step S3, constructing a dynamic model of each unmanned system, the dynamic models being affected by an uncertainty of system parameters and an influence of network attack inputs of the unmanned cluster system;

step S4, constructing an uncertainty boundary function of each unmanned system based on the dynamic model correspondingly, and the uncertainty boundary function being relative to the uncertainty and the influence; and step S5, constructing an adaptive robust controller of each unmanned system according to the constraint following error and the uncertainty boundary function correspondingly;

wherein the step for constructing the uncertainty boundary function comprises:

step S41, decomposing the dynamic model of an i'th unmanned system as follows according to an effect on the uncertainty of system parameters:

$$\begin{cases} \mathcal{M}_i(p^i,t) := \overline{\mathcal{M}}_i(p^i,t) + \Delta\mathcal{M}_i(p^i,t) \\ H_i(p^i,t) := \overline{\mathcal{M}}_i^{-1}(p^i,t) \\ \Delta H_i(p^i,\varrho_i,t) := \mathcal{M}_i^{-1}(p^i,\varrho_i,t) - \overline{\mathcal{M}}_i^{-1}(p^i,t) \\ E_i(p^i,\varrho_i,t) := \overline{\mathcal{M}}_i(p^i,t)\mathcal{M}_i^{-1}(p^i,\varrho_i,t) - I \\ \Delta H_i(p^i,\varrho_i,t) := H_i(p^i,t)E_i(p^i,\varrho_i,t) \end{cases}$$

in these formulas, $\overline{\mathcal{M}}_i$ being defined as a nominal part and the $\Delta\mathcal{M}_i(p^i,t)$ being defined as an uncertain part;

$\mathcal{M}_i(p^i,\varrho_i,t)$ meaning an inertia matrix of the i'th unmanned system; each of $H_i$, $\Delta H_i$, and $E_i$ being defined as an algebraic quantity; i meaning a sequence number of the unmanned system on the unmanned cluster system, $i\in N^+$, $N^+=\{1, 2, \ldots, n\}$; n meaning a total number of the unmanned systems; $p^i$ meaning a spatial position of the i'th unmanned system; t meaning time; $\varrho_i$ meaning the uncertainty of system parameters of the i'th unmanned system;

step S42, decomposing an input matrix $D_{ai}$ of the i'th unmanned system based on the network attack input as follows:

$$D_{ai} = \hat{D}_{ai} + \tilde{D}_{ai}$$

in this formula, $$\begin{cases} \hat{D}_{ai} = (A_iH_i)^T[(A_iH_i)(A_iH_i)^T]^{-1}A_iH_iD_{ai} \\ \tilde{D}_{ai} = D_{ai} - (A_iH_i)^T[(A_iH_i)(A_iH_i)^T]^{-1}A_iH_iD_{ai} \end{cases};$$

$A_i$ meaning a constrain matrix; and step S43, getting a boundary function $\Theta_i(\gamma_i,p^i,\dot{p}^i,t)$ for describing uncertainty boundary information of the uncertainty and the influence, the step of getting the boundary function $\Theta_i(\gamma_i,p^i,\dot{p}^i,t)$ comprising:

(a) constructing a formula with a constant vector yi and the boundary function $\Theta_i(\gamma_i,p^i,\dot{p}^i,t)$ as follows:

$$\max_{\varrho_i\in\Gamma_i, v_{ai}\in\Sigma_i} \|K_i A_i(p^i,t)[M_i^{-1}(p^i,\varrho_i,t)(-C_i(p^i,\dot{p}^i,\varrho_i,t)\dot{p}^i -$$

$$G_i(p^i,\varrho_i,t) - F_i(p^i,\dot{p}^i,\varrho_i,t)) - H_i(p^i,t)\hat{D}_{ai}(p^i,\dot{p}^i,t)v_{ai} -$$

$$\Delta H_i(p^i,t)D_{ai}(p^i,\dot{p}^i,t)v_{ai}] - K_i b_i\| \le (1+\delta_{E_i})\Theta_i(\gamma_i,p^i,\dot{p}^i,t)$$

in this formula, $\gamma_i$ meaning uncertain variables of the i'th unmanned system, $K_i$ meaning a positive definite matrix of the i'th unmanned system, $b_i$ meaning a second-order constrained vector of the i'th unmanned system; $v_{ai}$ meaning the network attack input of the i'th unmanned system, $v_{ai}\in\Sigma_i\subset R^l$, $\Sigma_i\subset R^l$ meaning a compact set of the unmanned cluster system, $R^l$ meaning l dimensional vector space in a field of real numbers, $\Sigma_i$ meaning a possible boundary of $v_{ai}$; $\varrho_i(t)$ meaning the uncertainty of system parameters of the i'th unmanned system, $\varrho_i(t)\subset\gamma_i\subset R^p$, $R^p$ meaning p dimensional vector space in the field of real numbers, $\gamma_i$ meaning a possible boundary of $\varrho_i(t)$; $C_i(p^i,\dot{p}^i,\varrho_i,t)\dot{p}^i$ meaning a Coriolis/Centrifugal force, $G_i(p^i,\varrho_i,t)$ meaning a gravitational force, $F_i(p^i,\dot{p}^i,\varrho_i,t)$ meaning the other force; $\delta_{E_i}$ meaning a constant satisfying the following condition:

$$-2 < 2\delta_{E_i} \le \min_{\varrho_i\in\Gamma_i}\lambda_{min}[\phi_i(p^i,\varrho_i,t) + \phi_i^T(p^i,\varrho_i,t)],$$

in this formula, $$\Phi_i(p^i, \varrho_i, t) = K_i A_i(p^i, t) H_i(p^i, t) E_i(p^i, \varrho_i, t) \overline{\mathcal{M}}_i(p^i, t) \times$$
$$A_i^T(p^i, t)(A_i(p^i, t) A_i^T(p^i, t))^{-1} K_i^{-1}$$

$\lambda_{min}(\bullet)$ meaning a minimum value of a matrix eigenvalue; and (b) the boundary function $\Theta_i(\gamma_i, p^i, \dot{p}^i, t)$ being a continuous concave function as for the constant vector $\gamma_i$, and to any vector in the field of real numbers, $\gamma_{i1}$ and $\gamma_{i2}$ meeting the following condition:

$$\Theta_i(\gamma_{i1}) - \Theta(\gamma_{i2}) \leq \frac{\partial \Theta_i}{\partial \gamma_i}(\gamma_{i2})(\gamma_{i1} - \gamma_{i2});$$

wherein the step of constructing the adaptive robust controller comprises:

step S51, constructing an adaptive law $\hat{\dot{\gamma}}_i$ for estimating the constant vector $\gamma_i$ based on the constraint following error $\epsilon_i$ and the boundary function $\Theta_i(\hat{\gamma}_i, p^i, \dot{p}^i, t)$, $$\hat{\dot{\gamma}}_i = Y_{i1} \frac{\partial \Theta_i^T}{\partial \gamma_i}(\hat{\gamma}_i, p^i, \dot{p}^i, t) \|\epsilon_i\| - Y_{i2} \hat{\gamma}_i$$

in this formula, $\hat{\gamma}_i$ being an estimated value of $\gamma_i$, $\hat{\gamma}_i(t_0) > 0$, $t_0$ meaning an initial time; $Y_{i1}$ and $Y_{i2}$ both meaning a parameter matrix with adjustable adaptive law, $Y_{i1} 0$, $Y_{i2} 0$, $\dot{p}^i$ meaning a speed of the i'th unmanned system;

step S52, constructing an adaptive robust controller as following formulas based on the adaptive law $\hat{\dot{\gamma}}_i$ and the constraint following error $\epsilon_i$:

$$\tau_i(t) = s_{i1}(p^i, \dot{p}^i, t) + s_{i2}(\hat{\gamma}_i, p^i, \dot{p}^i, t)$$
$$s_{i1}(p^i, \dot{p}^i, t) = -\kappa_i \overline{\mathcal{M}}_i(p^i, t) A_i^T(p^i, t)[A_i(p^i, t) A_i^T(p^i, t)]^{-1} K_i^{-1} \epsilon_i(p^i, \dot{p}^i, t)$$
$$s_{i2}(\hat{\gamma}_i, p^i, \dot{p}^i, t) =$$
$$-\overline{\mathcal{M}}_i(p^i, t) A_i^T(p^i, t)(A_i(p^i, t) A_i^T(p^i, t))^{-1} K_i^{-1} \epsilon_i(p^i, \dot{p}^i, t) \times \Theta_i^2(\hat{\gamma}_i, p^i, \dot{p}^i, t)$$

in this formula, $\kappa_i$ meaning a controlling and adjusting parameter which is greater than 0; $s_{i1}(p^i, \dot{p}^i t)$ used to handle initial incompatibility problems; $s_{i2}(\hat{\gamma}_i, p^i, \dot{p}^i, t)$ used to handle the uncertainty and the influence; $A_i(p^i, t)$ meaning the constrain matrix of the i'th unmanned system; and step S6, controlling the unmanned cluster system using the constructed adaptive robust controller.

9. The non-transitory readable computer storage media according to claim 8, wherein in step S1, the spatial status information of each target comprises p* and $\dot{p}^*(t)$ also named $\dot{p}^*$, p* meaning the spatial position of the corresponding target, $\dot{p}^*$ meaning the speed of the corresponding target; the spatial status information of each unmanned system comprises $p^i$ and $\dot{p}^i(t)$ also named $\dot{p}^i$, $p^i \in R^k$, k meaning the coordinate dimension of each unmanned system, $R^k$ meaning k dimensional vector space in the field of real numbers.

10. The non-transitory readable computer storage media according to claim 9, wherein the step for getting the constraint following error comprises:

step S21, ensuring a potential function $U_{ij}(\bullet)$ with regard to the i'th unmanned system and a j'th unmanned system, and solving a partial derivative of the potential function $U_{ij}(\bullet)$ according to $p^i$ and $p^j$, $p^j$ meaning a spatial position of the j'th unmanned system, $j \in N^+$;

step S22, ensuring a potential function $U_{i*}(\bullet)$ with regard to the i'th unmanned system and the corresponding target; and solving a partial derivative of the potential function $U_{i*}(\bullet)$ according to $p^i$ and p*;

step S23, establishing the kinematic model of the unmanned cluster system:

$$\dot{p}^i = -\sum_{j=1, j \neq i}^{n} \frac{\partial U_{ij}}{\partial p^i}(p^i, p^j) - \frac{\partial U_{i*}}{\partial p^i}(p^i, p^*) + \dot{p}^*$$

step S24, transforming the kinematic model to a first-order constrained-differential equation with performance constraint:

$$A_i(p^i, t) \dot{p}^i = c_i(p^i, t),$$

solving a partial derivative of the first-order constrained-differential equation to a second-order standard constraint form by transposing:

$$A_i(p^i, t) \ddot{p}^i = b_i(p^i, \dot{p}^i, t);$$

then, getting the constraint following error $\epsilon_i$:

$$\epsilon_i = A_i(p^i, t) \dot{p}^i - c_i(p^i, t)$$

in these formulas, $c_i(p^i, t)$ meaning a first-order constrained vector of the i'th unmanned system, $b_i(p^i, \dot{p}^i, t)$ meaning a second-order constrained vector of the i'th unmanned system.

11. The non-transitory readable computer storage media according to claim 10, wherein the step for constructing the dynamic model comprises:

step S31, constructing the dynamic model as follows:

$$M_i(p^i(t), \varrho_i(t), t) \ddot{p}^i(t) + C_i(p^i(t), \dot{p}^i(t), \varrho_i(t), t) \dot{p}^i(t) +$$
$$G_i(p^i(t), \varrho_i(t), t) + F_i(p^i(t), \dot{p}^i(t), \varrho_i(t), t) = \tau_i(t)$$

$\ddot{p}^u(t)$ meaning an accelerated speed of the i'th unmanned system also named $\ddot{p}^i$; $\tau_i(t)$ meaning an input of control force; $\mathcal{M}_i(p^i, \varrho_i, t)$, $C_i(p^i, \dot{p}^i, \varrho_i, t) \dot{p}^i$, $F_i(p^i, \dot{p}^i, \varrho_i, t)$, $G_i(p^i, \varrho_i, t)$, all being exact dimensions; $M_i(\bullet)$, $C_i(\bullet)$, $G_i(\bullet)$, $F_i(\bullet)$ all being continuous function;

step S32, reconstructing the dynamic model as follows:

$$M_i(p^i(t), \varrho_i(t), t) \ddot{p}^i(t) + C_i(p^i(t), \dot{p}^i(t), \varrho_i(t), t) \dot{p}^i(t) + G_i(p^i(t), \varrho_i(t), t) +$$

-continued $$F_i(p^i(t), \dot{p}^i(t), \varrho_i(t), t) + D_{ai}(p^i(t), \dot{p}^i(t), t)v_{ai} = \phi_i(t)\tau_i(t)$$

$D_{ai}(p^i(t),\dot{p}^i(t),t)$ meaning input matrix of the network attack input of the i'th unmanned system, $\phi_i(t)$ meaning an influence coefficient for controlling the network attack input; $D_{ai}(p^i(t),\dot{p}^i(t),t)$ being an exact dimension; $D_{ai}(\bullet)$ being a continuous function;

step S33, setting constraint conditions to the dynamic model:

if any $(p^i,t)$ being $(p^i,t) \in R^k \times R$, $\varrho_i \in \Gamma_i$, the inertia matrix $M_i(p^i,\varrho_i,t)$ meaning a positive definite matrix;

if any $(p^i,t)$ being $(p^i, t) \in R^k \times R$ and $A_i(p^i,t)$ being full rank, the inertia matrix $A_i(p^i,t) A_i^T(p^i,t)$ being reversible;

if any t being $t \in R$, $\phi_i(t)$ having a lower limiting value $\overline{\phi}_i$, $\overline{\phi}_i \leq \phi_i(t) \leq 1$.

12. The non-transitory readable computer storage media according to claim 8, wherein the step for collaborative controlling networks resilience comprises:

Step S53, analyzing a stability of the adaptive robust controller by a Lyapunov function as follows:

$$V = \sum_{i=1}^{n} V_i$$

$$V_i = \frac{1}{2}\epsilon_i^T K_i \epsilon_i + \frac{1}{2}(1 + \delta_{E_i})(\hat{\gamma}_i - \gamma_i)^T Y_{i1}^{-1}(\hat{\gamma}_i - \gamma_i).$$

13. The non-transitory readable computer storage media according to claim 8, wherein the step of constructing the adaptive robust controller further comprises:

step S54, adjusting parameters of the adaptive robust controller, the parameters comprising $\kappa_i$, $Y_{i1}$, $Y_{i2}$.

* * * * *